(12) United States Patent
Aletsee et al.

(10) Patent No.: US 11,082,076 B2
(45) Date of Patent: Aug. 3, 2021

(54) METHOD AND DEVICE FOR TRANSMITTING OR RECEIVING AT LEAST ONE HIGH-FREQUENCY SIGNAL USING PARALLEL AND UNDERSAMPLED BASEBAND SIGNAL PROCESSING

(71) Applicant: Rosenberger Hochfrequenztechnik GmbH & Co. KG, Fridolfing (DE)

(72) Inventors: Franz G. Aletsee, Backnang (DE); Reinhard Stolle, Aresing (DE)

(73) Assignee: ROSENBERGER HOCHFREQUENZTECHNIK GMBH & CO. KG, Fridolfing (DE)

( * ) Notice: Subject to any disclaimer, the term of this patent is extended or adjusted under 35 U.S.C. 154(b) by 0 days.

(21) Appl. No.: 16/464,280

(22) PCT Filed: Nov. 20, 2017

(86) PCT No.: PCT/EP2017/079778
§ 371 (c)(1),
(2) Date: May 27, 2019

(87) PCT Pub. No.: WO2018/108460
PCT Pub. Date: Jun. 21, 2018

(65) Prior Publication Data
US 2020/0259513 A1 Aug. 13, 2020

(30) Foreign Application Priority Data
Dec. 12, 2016 (DE) .................... 10 2016 014 795.4

(51) Int. Cl.
*H04B 1/10* (2006.01)
*H03M 1/12* (2006.01)
(Continued)

(52) U.S. Cl.
CPC .......... *H04B 1/1036* (2013.01); *H03M 1/124* (2013.01); *H03M 1/662* (2013.01);
(Continued)

(58) Field of Classification Search
CPC .................... H04L 25/03057; H04L 25/03159
(Continued)

(56) References Cited

U.S. PATENT DOCUMENTS 5,568,142 A * 10/1996 Velazquez .......... H03H 17/0266
341/126
7,450,911 B1 11/2008 Venkatesh
(Continued)

FOREIGN PATENT DOCUMENTS

DE 102006043411 B4 3/2008
EP 1507341 A2 2/2005

OTHER PUBLICATIONS

Song, Z.; Lelandais-Perrault, C.; Benabes, P.: Synthesis of Complex Subband Hybrid Filter Banks A/D Converters using Adaptive Filters. In IEEE International Conference on Electronics, Circuits and Systems, 2009, S. 399-402. IEEE XPlore [online]. DOI: 10.1109/ICECS.2009.5410906.

*Primary Examiner* — Shuwang Liu
*Assistant Examiner* — Gina M McKie
(74) *Attorney, Agent, or Firm* — David P. Dickerson

(57) ABSTRACT

A method and apparatus for processing or generating a high-frequency signal using parallel and undersampled baseband signal processing in the frequency domain.

20 Claims, 10 Drawing Sheets

(51) Int. Cl.
*H03M 1/66* (2006.01)
*H04L 25/03* (2006.01)

(52) U.S. Cl.
CPC .. *H04L 25/03127* (2013.01); *H04L 25/03159* (2013.01); *H04L 25/03343* (2013.01)

(58) Field of Classification Search
USPC .......................................................... 375/348
See application file for complete search history.

(56) References Cited

U.S. PATENT DOCUMENTS

| | | | |
|---|---|---|---|
| 9,264,059 B2 | 2/2016 | Tousi | |
| 10,277,346 B1* | 4/2019 | Downey | H04B 1/06 |
| 2005/0099327 A1 | 5/2005 | Robinson | |
| 2006/0133538 A1* | 6/2006 | Stojanovic | H04L 27/2653 |
| | | | 375/308 |
| 2007/0205922 A1* | 9/2007 | Itakura | H03M 5/145 |
| | | | 341/50 |
| 2008/0198051 A1* | 8/2008 | Tanimura | H04L 7/007 |
| | | | 341/137 |
| 2009/0115650 A1* | 5/2009 | Tietjen | H04B 1/0007 |
| | | | 341/141 |
| 2012/0269234 A1* | 10/2012 | Zhang | H04L 27/2653 |
| | | | 375/143 |
| 2012/0281746 A1* | 11/2012 | Herrmann | H04B 3/32 |
| | | | 375/229 |
| 2016/0341774 A1* | 11/2016 | Veitsel | G01R 23/173 |

\* cited by examiner

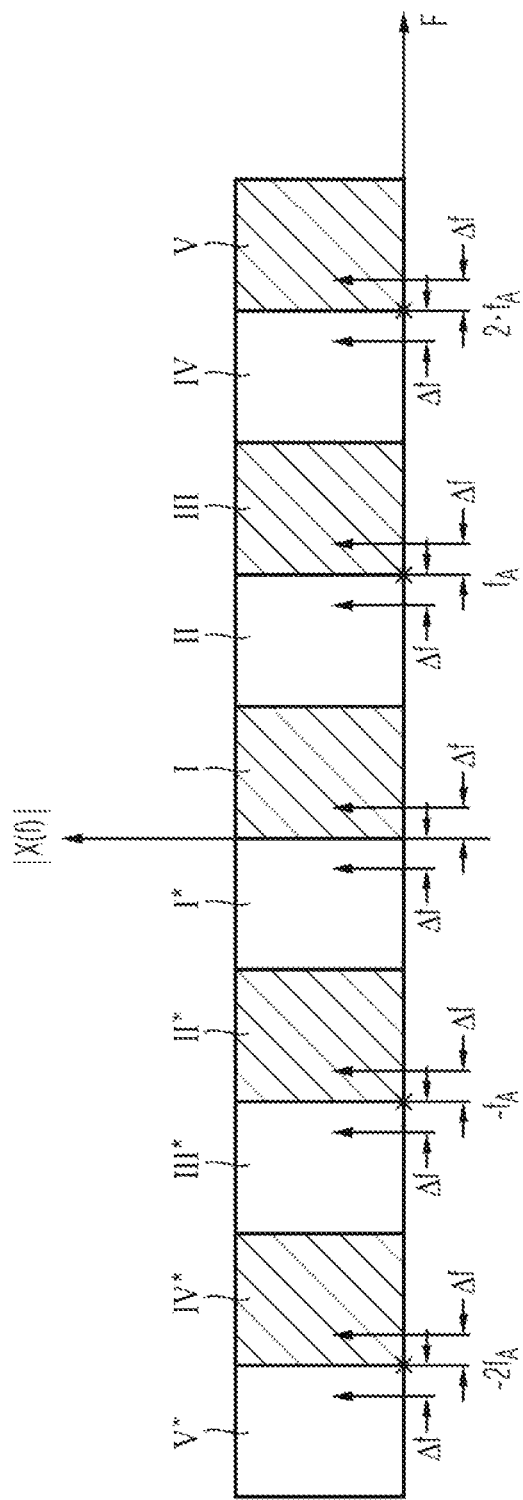

METHOD AND DEVICE FOR TRANSMITTING OR RECEIVING AT LEAST ONE HIGH-FREQUENCY SIGNAL USING PARALLEL AND UNDERSAMPLED BASEBAND SIGNAL PROCESSING

TECHNICAL FIELD

The present disclosure relates to a method and a device for transmitting or receiving at least one high-frequency signal using parallel and undersampled baseband signal processing, and a system for transmitting at least one high-frequency signal using parallel and undersampled baseband signal processing.

BACKGROUND ART

The continuously growing data volume which is to be transmitted in all technical domains increasingly requires higher and higher data rates in the data transmission and therefore higher and higher bandwidths of the high-frequency carrier signal. Technical devices and technical systems which receive or capture a high-frequency signal modulated with data frequently perform an analog-to-digital conversion in combination with a mixing into the baseband. The further signal processing and data processing takes place in the digital baseband.

An analog-to-digital conversion of a very high-frequency signal is performed through parallelization in a plurality of parallel-connected analog-to-digital converters. Here, each individual analog-to-digital converter sequentially and consecutively samples a specific signal segment of the high-frequency signal. A time interleaved analog-to-digital conversion of this type is described, for example, in U.S. Pat. No. 9,264,059 B2. With limited signal processing power of each individual analog-to-digital converter, the parallelization enables the implementation of a sampling rate corresponding to the Nyquist criterion for very high-frequency signals.

A complete capture of the analog high-frequency signal from the associated sampled high-frequency signal requires, on the one hand, an exact adherence to the phase offset in each case between two consecutively sampling analog-to-digital converters. On the other hand, all parallel-sampling analog-to-digital converters must have an identical signal processing behavior, for example an identical amplification, an identical quantization characteristic and no offset.

Time-interleaved sampling analog-to-digital converters do not meet these requirements. In order to minimize this negative technical effect, time-interleaved sampling analog-to-digital converters disadvantageously have compensation or equalization devices implemented at high cost which often only minimize, but do not completely compensate, the inaccuracies which occur.

On the transmitter side, a plurality of parallel-operating digital-to-analog converters are also possible for the transmission of a high data volume in a high-frequency signal. The analog baseband signals generated in each case by the parallel-operating digital-to-analog converters are to be mixed in each case via a mixer in each case onto a high-frequency carrier which is located in each case in a different frequency range within the high-frequency signal to be transmitted. The parallel-connected mixers and the associated carrier signal generation disadvantageously also incur a high implementation cost.

The object of the present disclosure is therefore to provide a method and a device for transmitting and receiving very high-frequency signals, said method and device not having the aforementioned technical disadvantages.

SUMMARY OF THE INVENTION

Pursuant to the teachings of the present disclosure, the individual received or captured high-frequency signal may be fed to a plurality of parallel-connected filters which in each case have a different filter frequency response. The output of each filter is connected to the input of an associated analog-to-digital converter. Pursuant to the teachings of the present disclosure, each analog-to-digital converter may form an undersampling of the filtered signal fed by the associated filter.

An undersampling is understood below to mean a sampling of an analog signal into an associated digitized signal in which the sampling frequency is less, preferably very much less, than twice the value of the highest spectral frequency contained in the analog signal. Consequently, an undersampling does not meet the Nyquist criterion known in digital signal processing which, for a correct reconstruction of the analog signal from the associated digitized signal, specifies a sampling frequency which corresponds to at least twice the value of the highest spectral frequency contained in the analog signal.

A filtered signal is understood below to mean a signal which is generated and is therefore present at the output of a filter. The spectral components of a filtered signal of this type are consequently essentially limited to the pass frequency range of the filter.

Pursuant to the teachings of the present disclosure, the associated baseband signal components may be determined from each digitized filtered signal at the output of a respective analog-to-digital converter. The baseband signal components of the digitized bandpass signal are understood to mean all spectral components of the digitized filtered signal which lie within the digital baseband. The digital baseband extends in the spectral range from the negative half sampling frequency to the positive half sampling frequency.

Finally, all signal components of the high-frequency signal in the digital baseband are obtained by feeding the baseband signal components of the individual digitized filtered signals to an equalization.

A sampling of an analog signal has the effect that the spectrum of the associated digitized signal is composed of the superimposition of the periodically repeating spectrum of the analog signal, wherein the spectrum of the analog signal is repeated in a frequency pattern in each case of one sampling frequency. If an undersampling of the analog signal is performed, the individual repeating spectra of the analog signal are superimposed on one another. This superimposition is referred to as aliasing.

If a high-frequency signal modulated with a high data volume is considered, this high data volume is located in different frequency ranges of the high-frequency signal, i.e. in different frequency bands of the high-frequency signal. A high-frequency signal of this type thus typically has a multiplicity of spectral components located in each case in different frequency bands.

Through the periodic continuation of the spectrum associated with a high-frequency signal of this type in the frequency pattern in the amount of one sampling frequency, the individual spectral components of the high-frequency signal are in each case completely superimposed on one another in the case of an undersampling within each consecutive frequency segment which in each case has a bandwidth of one sampling frequency.

According to FIG. 1, the positive and the complex-conjugate negative spectral range of a real signal are divided into individual frequency ranges adjacent to one another which in each case have a bandwidth in the amount of a half sampling frequency and are referred to as the first Nyquist zone, second Nyquist zone, third Nyquist zone, etc. In the half of the baseband assigned in each case to the positive frequencies, i.e. in the first Nyquist zone, the spectral components of all odd Nyquist zones of the positive frequency range and all even Nyquist zones of the negative frequency range are superimposed on one another. In the half of the baseband assigned in each case to the negative frequencies, the spectral components of all even Nyquist zones of the positive frequency range and all odd Nyquist zones of the negative frequency range are superimposed on one another.

All spectral components of the high-frequency signal which are distributed over the bandwidth of the high-frequency signal before the undersampling are thus superimposed on one another following an undersampling within the baseband.

Pursuant to the teachings of the present disclosure, the individual filters in each case may have a different filter frequency response, wherein the individual filter frequency responses can in each case be completely or only partially or not at all superimposed on one another in the spectral range.

The spectral components of the individual high-frequency signal are mapped differently onto the individual baseband signal components of the associated digitized filtered signals according to the different frequency responses of the parallel-connected filters.

The filtering of the individual high-frequency signal in each case with a plurality of filters which in each case have a different filter frequency response represents a distortion and coupling of the signal components in individual spectral ranges of the high-frequency signal in a plurality of signal paths. The individual signal components in the individual spectral ranges of the individual high-frequency signal are determined by means of suitable equalization and decoupling of the baseband signal components of all digitized filtered signals.

The parallel filtering of the high-frequency signal which is performed in each case with different frequency responses, in combination with the undersampling of the individual filtered signals advantageously enables an analog-to-digital conversion of a high-frequency signal, preferably a very broadband signal, the comparatively low sampling frequency. In addition, the complex phase offset control and monitoring required in a time-interleaved analog-to-digital conversion are advantageously eliminated.

If the filter frequency responses of a plurality of filters in each case cover one or more Nyquist zones in parallel, diversity is created in this way. This diversity advantageously enables an increase in equalization quality, since the signal components from one Nyquist zone or from a plurality of Nyquist zones are incorporated multiple times, i.e. redundantly, into the equalization.

In accordance with some embodiments of the present disclosure, the filter frequency responses of all used parallel filters in combination may cover the entire frequency spectrum of the high-frequency signal. In this way, it is advantageously possible to feed the signal components in all frequency bands of the high-frequency signal to a baseband signal processing and a downstream data processing.

The undersampling may be performed with the same sampling frequency in all analog-to-digital converters. In this way, it is guaranteed that the Nyquist zones and therefore also the digital baseband in each case have an identical bandwidth in all digitized filtered signals. The arrangement of the Nyquist zones of the individual orders in the spectral range is also identical in all digitized filtered signals.

In this way, it is advantageously guaranteed that the equalization and decoupling of the baseband signal components of the individual digitized filtered signals are frequency-tuned in relation to one another in respect of the signal components in the individual Nyquist zones.

If the undersampling is carried out coherently, i.e. phase-synchronously, in some embodiments of the present disclosure, it is advantageously possible to use a DMT (Discrete Multi-Tone) signal as the high-frequency signal. The coherence of the undersampling in the individual analog-to-digital converters guarantees that the individual carriers of the DMT signal which lie in different frequency ranges and are therefore sampled in some instances by different analog-to-digital converters are sampled phase-synchronously. The phase-synchronous sampling of the individual carriers of the DMT signal in turn guarantees that the required orthogonality between the individual carriers of the DMT signal is also maintained between the analog-to-digital converters. If a carrier-frequency signal is used instead of a baseband transmission, OFDM (Orthogonal Frequency Division Multiplexing) can be used.

The equalization and decoupling of the baseband signal components of the individual digitized filtered signals is performed in some embodiments of the present disclosure in the time domain:

The signal components of the high-frequency signal in individual spectral ranges which correspond in each case to a specific Nyquist zone of the high-frequency signal are determined here by means of equalization of the baseband signal components of the individual digitized filtered signals:

To do this, for the definition of the signal components of the high-frequency signal in a spectral range of this type, the baseband signal components of the individual digitized filtered signals are fed in each case to a digital equalization filter and the digitized signals present at the output of the individual digital equalization filters are summed in a downstream summing element. An equalization filter is understood here and below to mean a digital filter which equalizes the distortion caused in the filter of the digitized filtered signal. In addition, the equalization is designed in such a way that only one Nyquist zone assigned in each case to the equalization and decoupling channel remains following summation with all other equalization filters.

An equalization and decoupling unit which comprises a number of equalization and decoupling channels corresponding to the number of Nyquist zones of the digitized high-frequency signal is thus required for the definition of the signal components of the high-frequency signal in all spectral ranges. Each equalization and decoupling channel in turn comprises a number of digital equalization filters corresponding to the number of parallel-connected filters and a summing element in each case connected downstream of the individual digital equalization filters.

An equalization and decoupling unit is understood here and below to mean a functional unit which, from the baseband signal components of each digitized filtered signal, determines the digitized signal components of the high-frequency signal in the individual frequency ranges corresponding in each case to the individual Nyquist zones of the digitized high-frequency signal. Not only are the signal components contained in each case in the individual frequency ranges decoupled here, but also the distortions caused in each case in the individual filters are cancelled.

An equalization and decoupling channel is understood here and below to mean the determination, from the baseband signal components of all digitized filtered signals, of the digitized signal components of the high-frequency signal in a single frequency range which corresponds to a single associated Nyquist zone of the high-frequency signal. An equalization and decoupling unit consequently comprises a number of equalization and decoupling channels corresponding to the number of considered Nyquist zones.

If the special case arises in which each filter in each case selects only a spectral range of the high-frequency signal which corresponds in each case to a different Nyquist zone of the digitized high-frequency signal, the equalizations of the baseband signal components of the individual digitized bandpass signals are decoupled from one another. For this purpose, the baseband signal components of each individual digitized filtered signal are advantageously to be fed in each case to only one digital equalization filter. The respective digital equalization filter supplies the signal components of the high-frequency signal here in a specific spectral range. A downstream summing element is not required in this case.

In some embodiments of the present disclosure, the equalization of the baseband signal components of the individual digitized filtered signals is performed in the spectral range:

To do this, the individual digitized filtered signals are fed in each case to a spectral transformer.

The spectral transformer may be implemented as a Fourier transformer. A digital filter to shorten the channel pulse response and a unit to remove the guard interval are optionally connected upstream of the Fourier transformer. The discrete Fourier spectrum of the digitized filtered signal is present at the output of the Fourier transformer.

Only the complex-value spectral values of the discrete spectrum of the individual digitized filtered signals located in the digital baseband spectrum are then given further attention.

For the definition of the signal components of the high-frequency signal in a specific spectral range which corresponds to a specific Nyquist zone of the high-frequency signal, the spectral value of the individual digitized filtered signal is multiplied in each case by an associated spectral equalization coefficient for each frequency in the digital baseband at which a spectral value of the individual digitized filtered signals is located. An equalization coefficient is understood here and below to mean the spectral value of the transmission function of an associated equalization filter at the considered frequency.

The spectral values of the individual digitized filtered signals multiplied in each case by the associated spectral equalization coefficients are then summed for a considered frequency.

This procedure of the individual multiplications and the following summation is carried out for each frequency point within the digital baseband at which a spectral value of the individual digitized filtered signals is in each case present.

An equalization and decoupling unit in the spectral range therefore comprises a number of equalization and decoupling channels corresponding to the number of considered Nyquist zones, said equalization and decoupling channels in each case having individual multiplying elements and a downstream summing element.

For the special case of a decoupled equalization of the baseband signal components of the individual digitized filtered signals, the spectral components of the individual digitized filtered signals are multiplied in the digital baseband only by an associated spectral equalization coefficient. A subsequent summation of the multiplication results is not required in this case.

In some embodiments of the present disclosure, not only the distortion in the respective filter, but also the distortion in the associated analog-to-digital converter, the distortion in the transmission channel and/or the distortion during the generation of the high-frequency signal to be transmitted, in particular the distortion in the transmitter filters, are taken into account.

In some embodiments of the present disclosure, the digital baseband signals to be transmitted in each case in a high-frequency signal are fed in each case on the transmitter side to a digital-to-analog converter in order to generate an associated analog signal. In the individual digital signals, the sampling rate of the respective digital signal is to be dimensioned in such a way that it is smaller, preferably significantly smaller, than double the highest spectral frequency in the associated analog signal.

Since the spectrum of an analog signal continues periodically in a corresponding digital signal in the pattern of the sampling frequency, the individual spectral components of the digital signal are in each case completely superimposed on one another within each consecutive frequency segment which in each case has a bandwidth of one sampling frequency.

A filter in each case downstream of each digital-to-analog converter generates a filtered signal corresponding to the respective analog signal. The filter frequency responses of the individual filters differ from one another, wherein the individual filter frequency responses in the spectral range can be completely or only partially or not at all superimposed on one another. The filter frequency responses of the individual filters in total cover the entire analog spectrum.

In one special case, the filter frequency response of each individual filter extends in each case over the frequency range of a different Nyquist zone of the individual digital signals. In this way, a different Nyquist zone can be selected in each case for each individual digital signal. The spectral components located in each case in the individual Nyquist zone comprise the complete and non-repeated spectral components of the associated analog signal. The repeated spectral components of each individual digital signal in a different frequency range corresponding to the respective Nyquist zone can thus be selected for the special case through the filtering.

A high-frequency signal is advantageously obtained without mixing through summation of the individual filtered signals to form the high-frequency signal to be transmitted.

If each individual digital-to-analog converter is connected in each case to the same clock source so that each digital-to-analog converter receives the same clock, the individual Nyquist zones are located in each case in the same frequency ranges in all digital signals.

The sampling values of the individual digital signals need not be held in the associated digital-to-analog converters in each case over the entire sampling period, but instead only over a time period reduced in comparison with the sampling period, in particular over a time period significantly reduced in comparison with the sampling period.

In this way, the zero points of the sinc spectral function which corresponds to the step function of the digital-to-analog conversion and which attenuates the spectrum of the analog signal generated in each case in the individual digital-to-analog converter are shifted in each case in the direction of higher frequencies. This frequency shift of the individual zero points of the sinc spectral function advantageously causes a lesser attenuation of the analog signal generated in each case in the individual digital-to-analog converter over a further frequency range.

Some embodiments of the present disclosure relate not only to the transmission or reception of a single high-frequency signal, but also comprise the transmission or reception of a plurality of high-frequency signals.

This operational case refers to multichannel transmission systems with a plurality of receive and transmit channels (Multiple-Input Multiple-Output (MIMO) system). Alternatively, combined transmission systems are also covered (Single-Input Multiple-Output (SIMO) system or Multiple-Input Single-Output (MISO) system).

BRIEF DESCRIPTION OF DRAWINGS

Exemplary embodiments of the present disclosure are explained in detail below with reference to the drawing. In the figures of the drawing:

FIG. 1 shows a spectral representation of the Nyquist zones of a digitized signal according to the prior art.

DETAILED DESCRIPTION

Figure 2A:
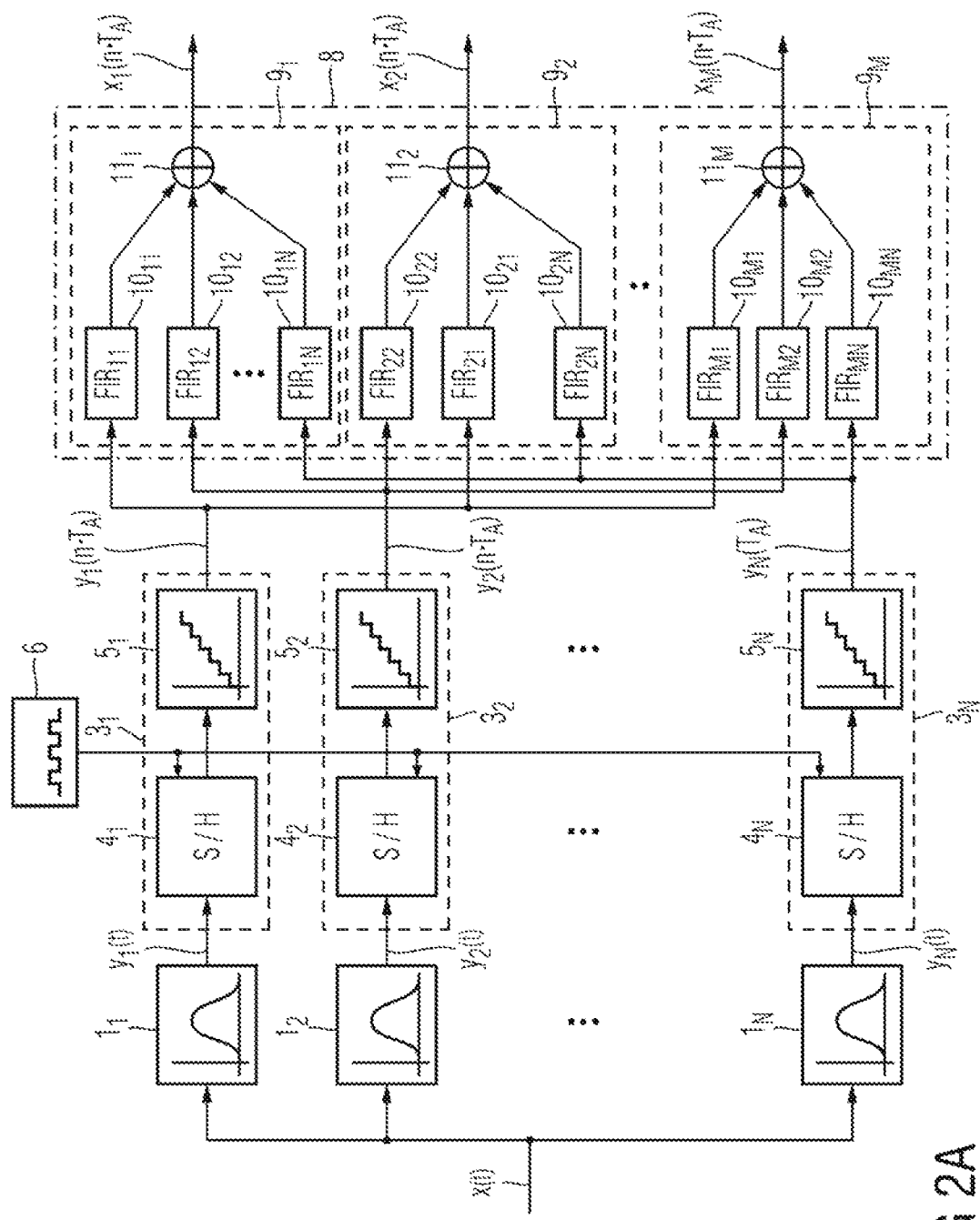
FIG. 2A shows a block diagram of a first subvariant of a first embodiment of a device pursuant with the present disclosure for receiving at least one high-frequency signal using parallel and undersampled baseband signal processing.

Before the individual embodiments for transmitting or receiving at least one high-frequency signal using parallel and undersampled baseband signal processing pursuant with the present disclosure are explained in detail with reference to the figures of the drawing, the mathematical foundations necessary for the understanding of the present disclosure are presented in advance:

A high-frequency signal $x(t)$ is convoluted in an analog filter i with the latter's pulse response $g_{Fi}(t)$. The filter i may be a bandpass filter. Alternatively, however, a low-pass filter, a high-pass filter, an all-pass filter or a filter with any given transmission function can also be used. Following a multiplication by the filter transmission function $G_{Fi}(f)$, the associated frequency spectrum $X(f)$ of the high-frequency signal $x(t)$ provides the frequency spectrum $Y_i(f)$ of the filtered signal present at the output of the filter according to equation (1).

$$Y_i(f) = G_{Fi}(f) \cdot X(f) \tag{1}$$

A discrete frequency spectrum is present following the analog-to-digital conversion and a subsequent discrete Fourier transform. The frequency spacing $\Delta f$ of the individual spectral components of a discrete frequency spectrum of this type corresponds to the frequency spacing between the individual carrier signals of the multicarrier method (DMT/OFDM) used in the high-frequency signal on which the individual modulated data are in each case present.

Due to the sampling, the spectrum of the filtered signal is repeated with a periodicity in the amount of the sampling frequency $f_A$. Ignoring the distortion of the filtered signal in the analog-to-digital conversion, the spectrum $Y_i(k \cdot \Delta f)$ of a spectral component of the high-frequency signal is obtained at the frequency $k \cdot \Delta f$ at the output of the analog-to-digital converter connected downstream of the filter i according to equation (2). The undersampling takes place in this step. A prerequisite here is that this spectral component is positioned within the pass bandwidth of the filter i. The parameters m and k represent integer run parameters.

$$Y_i(-k \cdot \Delta f) = \sum_{m=-\infty}^{+\infty} G_{Fi}(k \cdot \Delta f - m \cdot f_A) \cdot X(k \cdot \Delta f - m \cdot f_A) \tag{2}$$

For a real signal $y_i(n \cdot T_A)$, the associated spectrum $Y_i(k \cdot \Delta f)$ according to equation (3) has complex-conjugate symmetry.

$$Y_i(-k \cdot \Delta f) = Y_i^*(k \cdot \Delta f) \tag{3}$$

As shown in FIG. 1, due to the periodicity of the spectrum in the amount of the sampling frequency $f_A$ and due to the complex-conjugate symmetry of the spectrum, the ranges of the spectrum represented by dotted lines and continuing periodically which have a spectral width in each case of a half sampling frequency $f_A$ in each case have an identical spectrum. Equivalently, the ranges of the spectrum not represented by dotted lines and continuing periodically which similarly have a spectral width in each case of a half sampling frequency $f_A$ in each case have an identical spectrum.

Each of these ranges of the spectrum with or without dotted lines in each case represents a Nyquist zone. The order of the individual Nyquist zone increases starting from the axis of symmetry at the spectral frequency of zero.

Each Nyquist zone of an odd order in the positive spectral range, i.e. the Nyquist zones I, III and V, etc., in FIG. 1, and each Nyquist zone of an even order in the negative spectral range, i.e. the Nyquist zones II*, IV*, etc., in FIG. 1, since the spectra of these Nyquist zones are identical, contains not only the spectral components of its own associated analog spectrum, but also the spectral components of the analog spectra of the respective other assigned Nyquist zones. Equivalently, each Nyquist zone of an even order in the positive spectral range, i.e. the Nyquist zones II, IV, etc., in FIG. 1, and each Nyquist zone of an odd order in the negative spectral range, i.e. the Nyquist zones I*, III*, V*, etc., in FIG. 1, since the spectra of these Nyquist zones are identical, contains not only the spectral components of its own associated analog spectrum, but also the spectral components of the analog spectra of the respective other assigned Nyquist zones.

It is thus possible according to the present disclosure, through a spectral evaluation in the spectral range between the negative half sampling frequency and the positive half sampling frequency, i.e. in the baseband of the sampled signal, to determine the spectral components of the high-frequency signal in the Nyquist zones over which the filter frequency responses of all filters extend. If the filter covers a plurality of Nyquist zones, the baseband contains a linear combination of all contained Nyquist zones. In the case of real signals, only the positive or the negative half of the baseband spectrum has to be considered, since both are redundant in relation to one another.

The teachings of the present disclosure can also be applied to the I and Q signals at the output of an IQ mixer. The I and Q signal paths of the IQ mixer are in each case filtered in parallel and are undersampled by means of analog-to-digital conversion. The sampled values of the ADCs in the I signal path are interpreted as the real component, the sampling values of the ADCs in the Q signal path as the imaginary component. All further steps in a downstream equalization and decoupling unit remain the same.

The spectral component $L_i(k \cdot \Delta f)$ of the digitized filtered signal in the digital baseband at the spectral frequency $k \cdot \Delta f$ in which the spectral components of the digitized filtered signal at the spectral frequency $k \cdot \Delta f$ in all Nyquist zones of the filter frequency response of the respective filter are contained is obtained, taking account of equation (3), according to equation (4).

$$L_i(k \cdot \Delta f) = \sum_{m=-\infty}^{+\infty} G_{Fi}(k \cdot \Delta f + m \cdot f_A) \cdot X(k \cdot \Delta f + m \cdot f_A) \quad (4)$$

Only a limited number M of Nyquist zones are typically occupied in the receive signal. The infinite sum in equation (4) therefore becomes a finite sum according to equation (5).

$$L_i(k \cdot \Delta f) = \sum_{m=-\frac{M}{2}}^{+\frac{M}{2}-1} G_{Fi}(k \cdot \Delta f + m \cdot f_A) \cdot X(k \cdot \Delta f + m \cdot f_A) \quad (5)$$

Equivalently, equation (5) can also be represented vectorially according to equation (6).

$$L_i(k \cdot \Delta f) = \left[ G_{Fi}\left(k \cdot \Delta f - \frac{M}{2} \cdot f_A\right) \; \ldots \; G_{Fi}\left(k \cdot \Delta f + \left(\frac{M}{2} - 1\right) \cdot f_A\right) \right] \cdot \left[ X\left(k \cdot \Delta f - \frac{M}{2} \cdot f_A\right) \; \ldots \; X\left(k \cdot \Delta f + \left(\frac{M}{2} - 1\right) \cdot f_A\right) \right]^T \quad (6)$$

The individual coefficients $G_{Fi}$ of the first vector containing the filter transmission coefficient of the filter i at the spectral frequency $k \cdot \Delta f$ in the respective Nyquist zone. If the distortion due to the transmitter filters, due to the transmission channel and/or the associated analog-to-digital-converter is to be equalized in the same step, the coefficient $G_{Fi}$ in equation (6) contains both the transmission function of the filter i and the filter frequency responses of the transmitter filters, the channel transmission function and/or the transmission function of the associated analog-to-digital converter.

Equivalently, a vector equation according to equation (6) can be constructed for the remaining N−1 filters.

The combination of the vector equations of all used filters results in the matrix equation (7).

$$\overline{L}(k \cdot \Delta f) = \overline{F}(k \cdot \Delta f) \cdot \overline{X}(k \cdot \Delta f) \quad (7)$$

Both the undersampling and the filtering by the N filters are contained in equation (7). where $$\overline{L}(k \cdot \Delta f) = \begin{bmatrix} L_1(k \cdot \Delta f) \\ \vdots \\ L_N(k \cdot \Delta f) \end{bmatrix}$$

$$\overline{F}(k, \Delta f) = \begin{bmatrix} G_{F1}\left(k \cdot \Delta f - \frac{M}{2} \cdot f_A\right) & \ldots & G_{Fi}\left(k \cdot \Delta f + \left(\frac{M}{2} - 1\right) \cdot f_A\right) \\ \vdots & \vdots & \vdots \\ G_{FN}\left(k \cdot \Delta f - \frac{M}{2} \cdot f_A\right) & \ldots & G_{FN}\left(k \cdot \Delta f + \left(\frac{M}{2} - 1\right) \cdot f_A\right) \end{bmatrix}$$

$$\overline{X}(k \cdot \Delta f) = \left[ X\left(k \cdot \Delta f - \frac{M}{2} \cdot f_A\right) \; \ldots \; X\left(k \cdot \Delta f + \left(\frac{M}{2} - 1\right) \cdot f_A\right) \right]^T$$

If a plurality of transmission channels (MIMO) are used, the vector X increases according to the number of transmission channels that are used.

In a first variant of an equalization in the case of a low-noise useful signal, the frequency response of the individual digital equalization filter is defined as the inverse of the filter frequency response of the respective preceding filter (zero-forcing equalizer). The estimation vector $\hat{X}(k \cdot \Delta f)$ of the spectral component of the high-frequency signal at the spectral frequency $k \cdot \Delta f$ within the individual Nyquist zones is obtained here by means of matrix inversion of the matrix $\tilde{F}(k \cdot \Delta f)$ and subsequent multiplication of the inverse matrix $\tilde{F}^{-1}(k \cdot \Delta f)$ by the vector $\overline{L}(k \cdot \Delta f)$ which contains the Fourier transforms of the output signals of the individual analog-to-digital converters at the spectral frequency $k \cdot \Delta f$, according to the matrix equation (8).

$$\hat{X}(k \cdot \Delta f) = \tilde{F}^{-1}(k \cdot \Delta f) \cdot \overline{L}(k \cdot \Delta f) = \quad (8)$$

$$\begin{bmatrix} \hat{F}_1^1(k \cdot \Delta f) & \hat{F}_1^2(k \cdot \Delta f) & \ldots & \hat{F}_1^N(k \cdot \Delta f) \\ \vdots & \vdots & \vdots & \vdots \\ \hat{F}_M^1(k \cdot \Delta f) & \hat{F}_M^2(k \cdot \Delta f) & \ldots & \hat{F}_M^N(k \cdot \Delta f) \end{bmatrix} \cdot$$

$$[L_1(k \cdot \Delta f) \; L_2(k \cdot \Delta f) \; \ldots \; L_N(k \cdot \Delta f)]^T$$

In the Nyquist zones represented by shading in FIG. 1, the spectral frequency $k \cdot \Delta f$ is in each case the spectral frequency which has a spacing in the amount of $k \cdot \Delta f$ from the edge of the respective Nyquist zone shown on the left side in FIG. 1, and, in the Nyquist zones shown in each case without shading in FIG. 1, in each case the spectral frequency which has a spacing in the amount of $k \cdot \Delta f$ from the edge of the respective Nyquist zone shown on the right in FIG. 1.

In this way, it is possible to define consecutively the spectral components of the high-frequency signal in the spectral range in each case on the individual spectral frequencies of the carriers of the high-frequency signal.

In a second equalization variant for a useful signal with a higher noise component, the individual equalization coefficients are defined in such a way that the noise component is minimized in the equalization. A Minimum Mean Square Error (MMSE) equalization, for example, is carried out for this purpose. According to the prior art, the approach used for the equalization can also be any other approach which appears advantageous for achieving the object. MMSE and ZF represent two known and frequently used equalizer approaches.

Along with a definition of the spectral components of the high-frequency signal on the individual carrier frequencies in the spectral range, a definition in the time domain is essentially also possible.

A convolution of the pulse responses in each case associated with the individual filters with the high-frequency signal is to be performed instead of a multiplication of the filter transmission functions in each case associated with the individual filters by the Fourier transform for the mathematical derivation of a technical solution in the time domain. A mathematical derivation is foregone in this context.

On the transmitter side, the information contents of a specific number N of digital signals $u_1(n \cdot T_A)$, $u_2(n \cdot T_A)$, ..., $u_i(n \cdot T_A)$, ..., $u_N(n \cdot T_A)$ are transmitted in a high-frequency signal z(t) which is to be transmitted. Corresponding analog signals $v_1(t), v_2(t), \ldots, v_i(t), \ldots, v_N(t)$ are generated in each case via an analog-to-digital conversion.

Each digital sampling value $u_i(n \cdot T_A)$ generates a pulse having the form rect(t/TA). The digital-to-analog converter thus has a transmission function having the form $sinc(f/f_A)$ in which spectral components above the half sampling frequency are substantially attenuated. Due to the shortening of the hold time to T*<TA of the digital-to-analog converter, the zero points of the sinc-shaped transmission function can be shifted to higher frequencies so that the spectral components of the individual analog signals $v_1(t), v_2(t), \ldots, v_i(t), \ldots, v_N(t)$ remain undistorted in terms of amplitude over a further frequency range. A shortening of the hold time is achieved according to the prior art, for example, by oversampling.

In the individual filters in each case downstream of the respective digital-to-analog converters, a filtered signal $z_1(t), z_2(t), \ldots, z_N(t)$ is convoluted by means of convolution of the associated analog signal $v_1(t), v_2(t), \ldots, v_N(t)$ with a pulse response $g_{BP1}(t), g_{BP2}(t), \ldots, g_{BPN}(t)$ of the associated filter. The filter may be a bandpass filter, high-pass filter, low-pass filter or all-pass filter or a filter with any given filter transmission function. The passband of a filter can in each case completely or partially cover one or more Nyquist zones. It should be noted that the filter transmission functions of the individual filters must differ from one another and are intended in total to cover the entire spectral range of the high-frequency signal to be transmitted.

In one possible embodiment, the filter transmission function $G_{BPi}(f)$ of a bandpass filter i extends over the frequency range of a specific Nyquist zone, for example over the frequency range of the i-th Nyquist zone.

Finally, the individual filtered signals $z_1(t), z_2(t), \ldots, z_N(t)$ are added to the high-frequency signal z(t).

Figure 4:
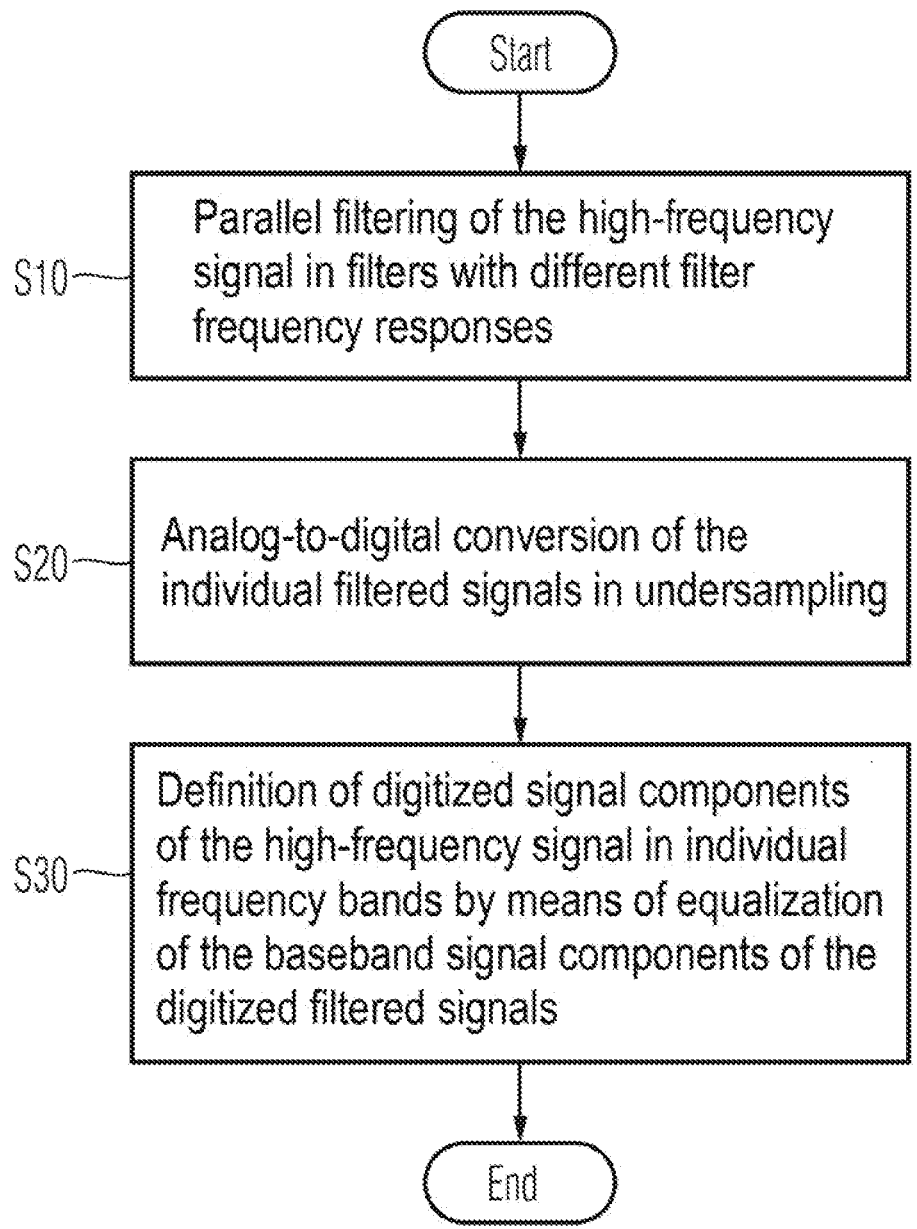
FIG. 4 shows a flow diagram of a first embodiment of a method pursuant with the present disclosure for receiving at least one high-frequency signal using parallel and undersampled baseband signal processing.

The two subvariants of the first embodiment of a device pursuant with the present disclosure for receiving at least one high-frequency signal using parallel and undersampled baseband signal processing are described in detail below on the basis of the described mathematical foundations with reference to the block diagrams in FIGS. 2A and 2B in combination with an associated method pursuant with the present disclosure for receiving at least one high-frequency signal using parallel and undersampled baseband signaling process with reference to the flow diagram in FIG. 4:

In the first method step S10, at least one high-frequency signal x(t) is fed in each case to a specific number N of parallel-connected filters $\mathbf{1}_1, \mathbf{1}_2, \ldots, \mathbf{1}_N$. The filters $\mathbf{1}_1, \mathbf{1}_2, \ldots \mathbf{1}_N$ are implemented in each case in analog form and in each case have a different filter frequency response. The filters here may be bandpass filters. Alternatively, however, low-pass filters, high-pass filters or all-pass filters or filters with any given filter transmission function can also be used.

Figure 6:
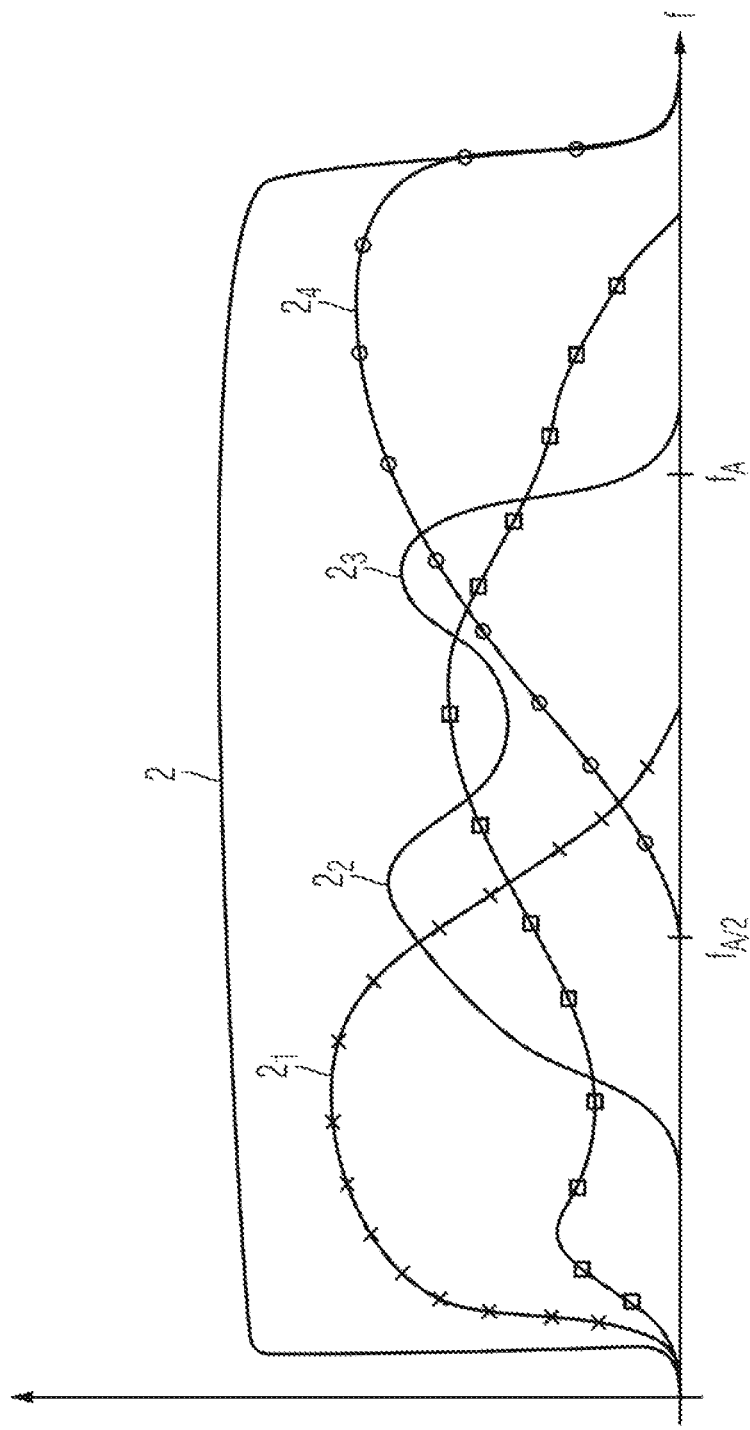
FIG. 6 shows a spectral representation of the characteristic of the filter frequency responses of the parallel filters of the devices pursuant with the present disclosure.

FIG. 6 shows examples of filter frequency responses $\mathbf{2}_1, \mathbf{2}_2, \mathbf{2}_3$ and $\mathbf{2}_4$ of four parallel-connected bandpass filters for a given frequency response 2 of the high-frequency signal. It is evident here that the passband of some filters extends over a plurality of Nyquist zones. In addition, the stop band can have a significant attenuation. This gives rise to further superimpositions in the baseband.

The filter frequency responses of the individual filters $\mathbf{1}_1, \mathbf{1}_2, \ldots, \mathbf{1}_N$ in combination cover the spectral ranges 2 in FIG. 6 of the high-frequency signal which are to be taken into account and examined in the further signal processing. If the entire spectral range of the high-frequency signal is relevant to the further signal processing, the filter frequency responses of the individual filters $\mathbf{1}_1, \mathbf{1}_2, \ldots \mathbf{1}_N$ cover the entire bandwidth of the high-frequency signal. If only specific frequency bands of the high-frequency signal are examined in the further signal processing, the combination of the filter frequency responses of the individual filters $\mathbf{1}_1, \mathbf{1}_2, \ldots \mathbf{1}_N$ is restricted to the spectral ranges of these frequency bands.

The filter frequency responses of the individual filters $\mathbf{1}_1, \mathbf{1}_2, \ldots \mathbf{1}_N$ can overlap one another completely, partially or not at all. It is crucial here, in the case of complete or partial overlap, that they in each case have a different filter frequency response in the spectral overlap range.

In the following method step S20, the filtered signals $y_1(t), y_2(t), \ldots, y_N(t)$ are converted at the output of the individual filters $\mathbf{1}_1, \mathbf{1}_2, \ldots, \mathbf{1}_N$ in each case in a downstream analog-to-digital converter $\mathbf{3}_1, \mathbf{3}_2, \ldots, \mathbf{3}_N$ into a corresponding digitized filtered signal $y_1(n \cdot T_A), y_2(n \cdot T_A), \ldots, y_N(T_A)$. The analog-to-digital conversion is performed here in undersampling. In order to implement the undersampling, the individual analog-to-digital converter $\mathbf{3}_1, \mathbf{3}_2, \ldots, \mathbf{3}_N$ may be implemented by way of a serial connection of a sample and hold (SH) element $\mathbf{4}_1, \mathbf{4}_2, \ldots, \mathbf{4}_N$ and a downstream quantizer $\mathbf{5}_1, \mathbf{5}_2, \ldots, \mathbf{5}_N$.

In the individual sample and hold elements $\mathbf{4}_1, \mathbf{4}_2, \ldots, \mathbf{4}_N$, in each case a sampling of the analog-filtered signal $y_1(t), y_2(t), \ldots, y_N(t)$ and a holding of the respective sampling value of the analog-filtered signal $y_1(t), y_2(t), \ldots, y_N(t)$ are performed in each case over the same sampling period $T_A$.

For the sampling, each sample and hold element $\mathbf{4}_1, \mathbf{4}_2, \ldots, \mathbf{4}_N$ receives a clock having the same sampling period $T_A$ from a clock source 6, for example a clock generator. The clock fed in each case to each sample and hold element $\mathbf{4}_1, \mathbf{4}_2, \ldots, \mathbf{4}_N$ is (phase-) coherent. The clock fed in each case to the individual sample and hold elements $\mathbf{4}_1, \mathbf{4}_2, \ldots, \mathbf{4}_N$ is phase-coherent if the phase of the individual clocks changes in each case over time in an identical manner and in each case said phases differ from one another only in a time-invariant phase difference. The clock source 6 may be implemented with minimal jitter in order to achieve the highest possible constancy in the sampling frequency $$\frac{1}{T_A},$$

since the phase error caused by jitter increases with the order of the Nyquist bands.

An amplitude quantization of the sampled filtered signal is performed in each case in the quantizer $5_1, 5_2, \ldots, 5_N$.

Only the baseband signal components $1_1(n \cdot T_A), 1_2(n \cdot T_A), \ldots, 1_N(n \cdot T_A)$ of the digitized filtered signals $y_1(n \cdot T_A), y_2(n \cdot T_A), \ldots, y_N(n \cdot T_A)$ are taken into account below. These baseband signal components $1_1(n \cdot T_A), 1_2(n \cdot T_A), \ldots, 1_N(n \cdot T_A)$ of the digitized filtered signals $y_1(n \cdot T_A), y_2(n \cdot T_A), \ldots, y_N(n \cdot T_A)$ contain, in each case superimposed, all spectral components of the high-frequency signal x(t) which lie within the passband of the filter frequency response of the respective filter $1_1, 1_2, \ldots 1_N$.

In order to separate the digitized spectral components of the high-frequency signal x(t) located in each case in the individual Nyquist zones from the individual baseband signal components $1_1(n \cdot T_A), 1_2(n \cdot T_A), \ldots, 1_N(n \cdot T_A)$ of the digitized filtered signals $y_1(n \cdot T_A), y_2(n \cdot T_A), \ldots, y_N(n \cdot T_A)$, the baseband signal components $1_1(n \cdot T_A), 1_2(n \cdot T_A), \ldots, 1_N(n \cdot T_A)$ of the individual digitized filtered signals $y_1(n \cdot T_A), y_2(n \cdot T_A), \ldots, y_N(n \cdot T_A)$ are fed in the following method step S30 to an equalization and decoupling in an equalization and decoupling unit 8.

This equalization and decoupling unit 8 contains a number M of equalization and decoupling channels $9_1, 9_2, \ldots, 9_M$, which corresponds to the number M of Nyquist zones contained in the bandwidth of the digitized high-frequency signal x(t).

Each individual equalization and decoupling channel $9_1, 9_2, \ldots, 9_M$ in turn contains a number of parallel-connected equalization filters $10_{11}, 10_{12}, \ldots, 10_{1N}$ or $10_{21}, 10_{22}, \ldots, 10_{2N}$ or $10_{M1}, 10_{M2}, \ldots, 10_{MN}$ corresponding to the number N of parallel-connected analog-to-digital converters $3_1, 3_2, \ldots, 3_N$. The inputs of the individual equalization filters of a respective equalization and decoupling channel are connected in each case to the output of an analog-to-digital-converter $3_1, 3_2, \ldots, 3_N$.

Each individual equalization filter of an equalization and decoupling channel in each case equalizes the supplied digitized filtered signal in such a way that, following a summation of all signals at the outputs of the equalization filters associated in each case with an equalization and decoupling channel, a signal is produced which contains only the signal components of the high-frequency signal x(t) within a Nyquist zone associated with the equalization and decoupling channel. Here, the respective equalization filter makes a contribution not only to the decoupling of the signal components contained in each case in the individual Nyquist zones, but also to the equalization of the distortion caused by the filter frequency response of the respective upstream filter.

In addition, the respective equalization filter can furthermore perform an equalization of the supplied signal in terms of the distortion caused in each case in the individual transmitter filters, the distortion caused in the transmission channel and/or the distortion caused in each case in the respective upstream analog-to-digital converter $3_1, 3_2, \ldots, 3_N$.

The individual equalization filters $10_{11}, 10_{12}, \ldots, 10_{1N}, 10_{21}, 10_{22}, \ldots, 10_{2N}, \ldots, 10_{M1}, 10_{M2}, \ldots, 10_{MN}$ are implemented in each case as digital filters, e.g. as digital filters with a finite pulse length (FIR filters). The individual equalization filters may be structured and parameterized in an initialization phase of the device. By supplying the device with specific test signals and by measuring the associated response signals of the device, the structure and the associated parameters of the equalization filter implemented as an adaptive digital filter are defined via optimization methods according to the prior art.

Alternatively, the structure and the associated parameters of the individual equalization filters can also be determined in a simulation-based manner. In rare exceptional cases, a deterministic definition of structures and parameters of the individual equalization filters is also possible.

In each individual equalization and decoupling channel $9_1, 9_2, \ldots, 9_M$, the outputs of the associated equalization filters are connected to a common summing element $11_1, 11_2, \ldots, 11_M$. The signal components $x_1(n \cdot T_A), \ldots, x_M(n \cdot T_A)$ of the high-frequency signal x(t) which are located in a specific Nyquist zone of the digitized high-frequency signal processed by the respective equalization and decoupling channel and therefore in a spectral range of the high-frequency signal associated with the respective Nyquist zone are present in each case at the output of the respective summing element $11_1, 11_2, \ldots, 11_M$.

The high-frequency signal x(t) is typically implemented as a multicarrier signal. A DMT (Discrete Multitone Transmission) signal may be used as the multicarrier signal. Alternatively, the high-frequency signal x(t) can also be implemented, for example, as an OFDM (Orthogonal Frequency Division Multiplexing) signal. Depending on the used sampling frequency $$\frac{1}{T_A}$$

of the undersampling, either the frequency band of one carrier or the frequency bands of a plurality of carriers of the OFDM signal can be placed in each case in a Nyquist zone. In order to guarantee the orthogonality of the individual frequency carriers, the clocks which are fed to the individual analog-to-digital converters $3_1, 3_2, \ldots, 3_N$ not only have an identical frequency $$\frac{1}{T_A}$$

of the clock, but are also to be designed as (phase-) coherent in relation to one another.

Figure 2B:
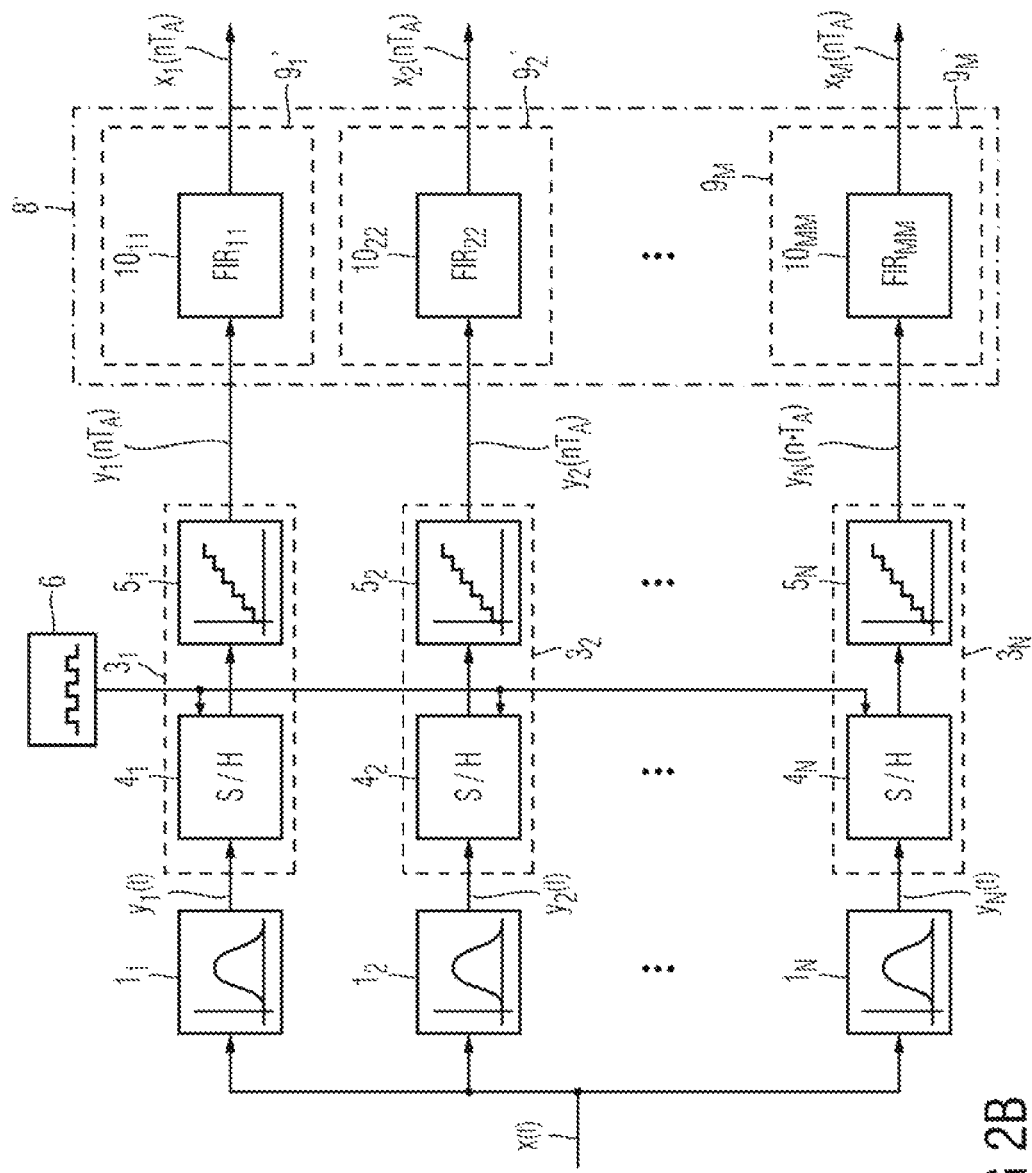
FIG. 2B shows a block diagram of a second subvariant of a first embodiment of a device pursuant with the present disclosure for receiving at least one high-frequency signal using parallel and undersampled baseband signal processing.

Along with this first subvariant of the first embodiment of the device pursuant with the present disclosure for receiving at least one high-frequency signal using parallel and undersampled baseband signal processing according to FIG. 2A, a second subvariant also exists as a special form according to FIG. 2B:

In the case of the second subvariant of the first embodiment of the device pursuant with the present disclosure for receiving at least one high-frequency signal using parallel and undersampled baseband signal processing, the filter frequency responses of the individual filters $1_1, 1_2, \ldots, 1_N$ are parameterized in such a way that their respective passband covers only the spectral range of a single Nyquist zone of the digitized high-frequency signal x(t).

The equalization and decoupling unit is simplified in this special case. The equalization and decoupling unit 8' of this second subvariant in each case contains only one single equalization filter $10_{11}', 10_{22}', \ldots, 10_{MM}'$ in its individual equalization and decoupling channels $9_1', 9_2', \ldots, 9_M'$. Each of these equalization filters $10_{11}', 10_{22}', \ldots, 10_{MM}'$ in each case equalizes the distortion caused in the preceding filter $1_1$, $1_2, \ldots, 1_N$. In addition, as already explained above for the first subvariant, the individual equalization filter $10_{11}'$, $10_{22}', \ldots, 10_{MM}'$ can also equalize the distortion caused in each case in the individual transmitter filters, the distortion caused in the transmission channel and/or the distortion caused in each case in the preceding analog-to-digital converter $3_1, 3_2, \ldots, 3_N$.

A summing element is not required in the individual equalization and decoupling channels $9_1'. 9_2', \ldots, 9_M'$.

The remaining functional units of the second subvariant of the first embodiment of the device pursuant with the present disclosure for receiving at least one high-frequency signal using parallel and undersampled baseband signal processing correspond to the first subvariant of the first embodiment and the description thereof is not therefore repeated at this juncture. With regard to the mode of operation of these functional units, reference is made to the associated description of the first subvariant of the first embodiment. The same applies to the second subvariant of the first embodiment of the method pursuant with the present disclosure for receiving at least one high-frequency signal using parallel and undersampled baseband signal processing.

Figure 5:
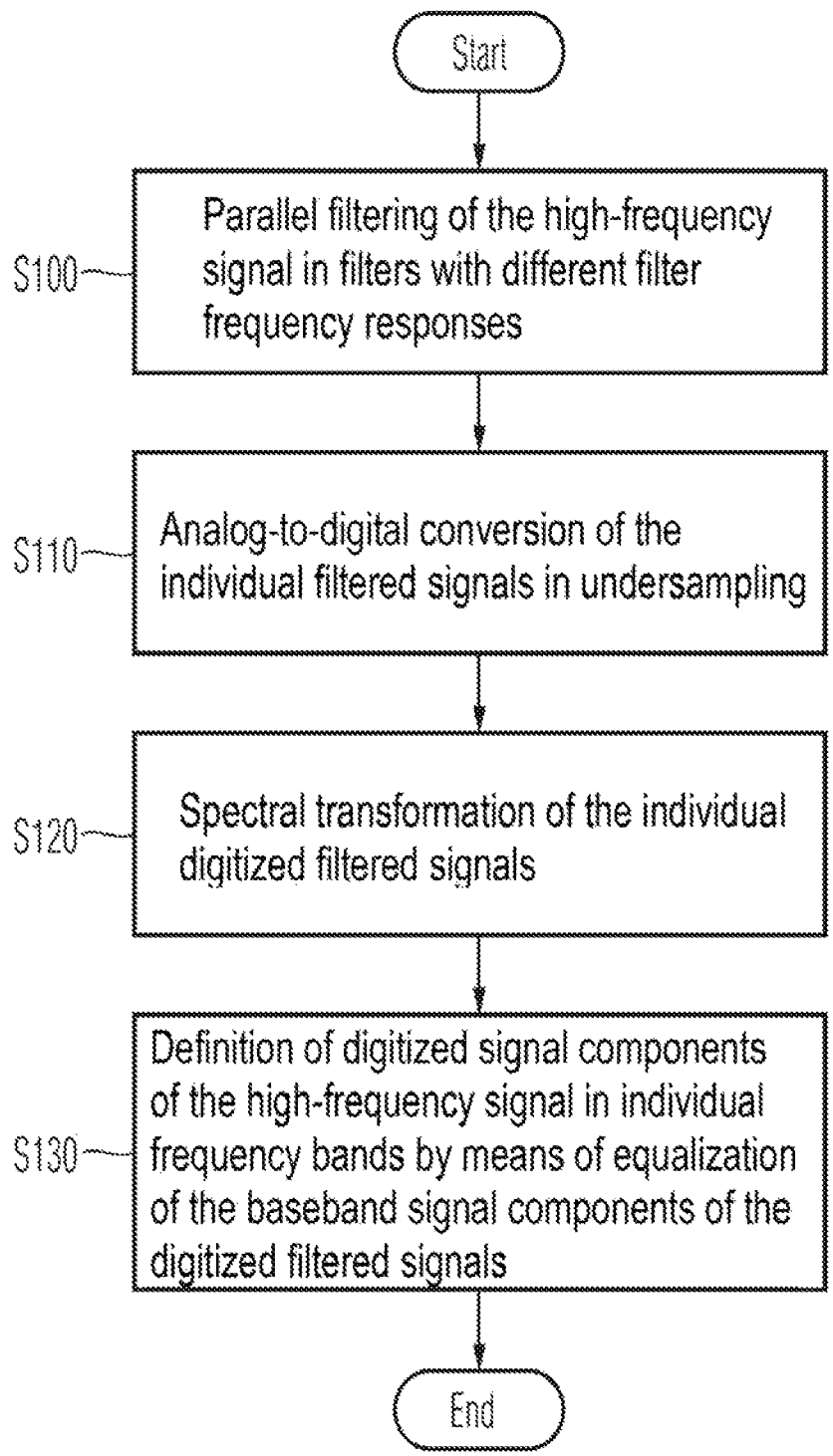
FIG. 5 shows a flow diagram of a second embodiment of a method pursuant with the present disclosure for receiving at least one high-frequency signal using parallel and undersampled baseband signal processing.

The two subvariants of the second embodiment of the device pursuant with the present disclosure for receiving at least one high-frequency signal using parallel and undersampled baseband signal processing are explained in detail below with reference to the block diagrams in FIGS. 3A and 38 in combination with the associated method pursuant with the present disclosure for receiving at least one high-frequency signal using parallel and undersampled baseband signal processing with reference to the flow diagram in FIG. 5:

The first two method steps S100 and S110 of the second embodiment of the method pursuant with the present disclosure for receiving at least one high-frequency signal using parallel and undersampled baseband signal processing correspond to the first two method steps S10 and S20 of the first embodiment of the method pursuant with the present disclosure. The same applies to the associated functional units of the second embodiment of the device pursuant with the present disclosure for receiving at least one high-frequency signal using parallel and undersampled baseband signal processing. The description is not therefore repeated at this juncture and reference is made to the associated descriptions of the first embodiment.

Figure 3A:
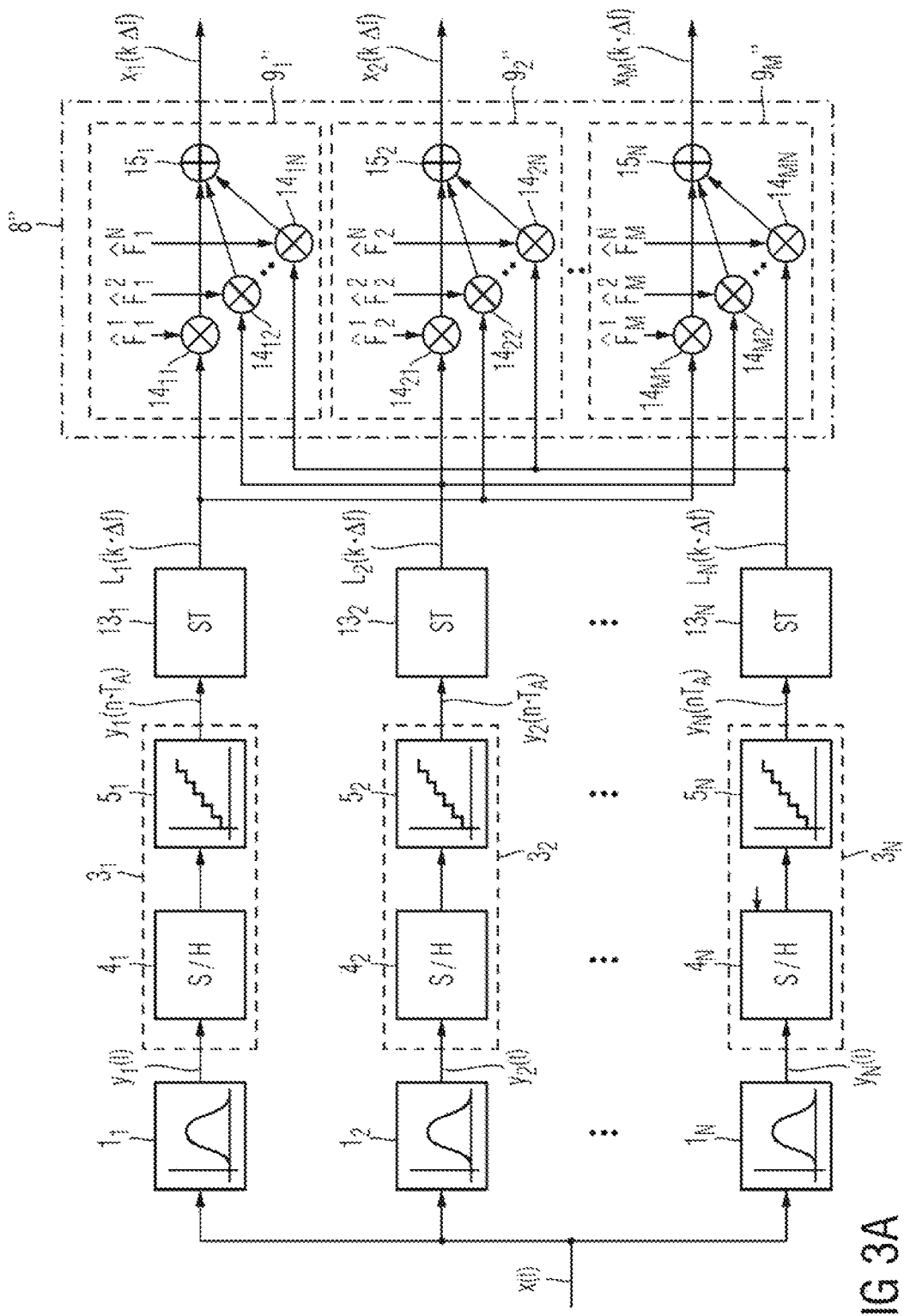
FIG. 3A shows a block diagram of a first subvariant of a second embodiment of a device pursuant with the present disclosure for receiving at least one high-frequency signal using parallel and undersampled baseband processing.

If DMT or OFDM is used as the transmission method, an optional filter, not shown in FIG. 3A, for shortening the channel pulse response and a unit for removing the guard interval are connected downstream of the respective analog-to-digital converter $3_1, 3_2, \ldots, 3_N$ in step S210. Finally, a Spectral Transformer (ST) $13_1, 13_2, \ldots, 13_N$ transforms the digitized filtered signal $y_1(n \cdot T_A), y_2(n \cdot T_A), \ldots, y_N(n \cdot T_A)$ into the respective associated discrete spectrum $y_1(k \cdot \Delta f), y_2(k \cdot \Delta f), \ldots, y_N(k \cdot \Delta f)$. This step may be carried out by means of a Fourier transform, by means of a Fast Fourier Transformer (FFT) or by means of a discrete Fourier Transformer (DFT).

In the following and concluding method step S130, only the baseband spectral components $L_1(k \cdot \Delta f), L_2(k \cdot \Delta f), \ldots, L_N(k \cdot \Delta f)$ of the digitized spectra $Y_1(k \cdot \Delta f), Y_2(k \cdot \Delta f), \ldots, Y_N(k \cdot \Delta f)$ are taken into account in a downstream equalization and decoupling unit 8.

Here, on the one hand, the spectral components contained in each case in the baseband spectral components $L_1(k \cdot \Delta f), L_2(k \cdot \Delta f), \ldots, L_N(k \cdot \Delta f)$ of the individual digitized spectra $Y_1(k \cdot \Delta f), Y_2(k \cdot \Delta f), \ldots, Y_N(k \cdot \Delta f)$ and associated in each case with the individual Nyquist zones of the digitized high-frequency signal are decoupled and combined with the spectral components of the digitized high-frequency signal which are associated in each case with one of the Nyquist zones of the digitized high-frequency signal. On the other hand, the distortion due to the filter frequency responses of the individual filters $1_1, 1_2, \ldots, 1_N$ which is present in the individual baseband spectral components $L_1(k \cdot \Delta f), L_2(k \cdot \Delta f), \ldots, L_N(k \cdot \Delta f)$ of the individual digitized spectra $Y_1(k \cdot \Delta f), Y_2(k \cdot \Delta f), \ldots, Y_N(k \cdot \Delta f)$ is equalized. In addition, similar to the first embodiment, an equalization of the distortion caused in each case in the individual transmitter filters, the distortion caused by the transmission channel and/or the distortions caused in each case by the transmission behavior of the analog-to-digital converters $3_1, 3_2, \ldots, 3_N$ and the downstream Fourier transformers $13_1, 13_2, \ldots, 13_N$ can be implemented in the equalization and decoupling unit 8".

The equalization and decoupling unit 8" is in turn made up of a number of parallel-connected equalization and decoupling channels $9_1" 9_2", \ldots, 9_M"$ corresponding to the number M of Nyquist zones within the bandwidth of the digitized high-frequency signal.

Each equalization and decoupling channel $9_1", 9_2", \ldots, 9_M"$ has a number of parallel multiplier elements $14_{11}, 14_{12}, \ldots, 14_{1N}$ or $14_{21}, 14_{22}, \ldots, 14_{2N}$ or $14_{M1}, 14_{M2}, \ldots, 14_{MN}$ corresponding to the number N of parallel-connected analog-to-digital converters $3_1, 3_2, \ldots, 3_N$.

A number of multiplier elements $14_{11}, 14_{12}, \ldots, 14_{1N}$ or $14_{21}, 14_{22}, \ldots, 14_{2N}$ or $14_{M1}, 14_{M2}, \ldots, 14_{MN}$ corresponding to the number N of Nyquist zones contained in the bandwidth of the digitized high-frequency signal are in each case present in each equalization and decoupling channel $9_1", 9_2", \ldots, 9_M"$. The input of each multiplier element of an equalization and decoupling channel $9_1", 9_2", \ldots, 9_M"$ is connected in each case to the output of an associated Fourier transformer $13_1, 13_2, \ldots, 13_N$.

Each individual multiplier element of an equalization and decoupling channel equalizes the respectively supplied discrete spectrum of the associated digitized filtered signal in such a way that, following a summation of all discrete spectra, a spectrum containing only the spectral components of the high-frequency signal x(t) within a Nyquist zone associated in each case with the equalization and decoupling channel is present at the outputs of the multiplier elements associated with an equalization and decoupling channel. For this purpose, each multiplier element $14ij$ (where $i \in \{1 \ldots M\}$ and $j \in \{1 \ldots N\}$) in each case multiplies the baseband spectral component $L_j(k \cdot \Delta f)$ of the respective spectrum $Y_j(k \cdot \Delta f)$ for each spectral frequency $k \cdot \Delta f$ by the associated spectral equalization coefficient $\hat{F}_i^j(k \cdot \Delta f)$ which is calculated, for example, according to equation (8).

The outputs of all multiplier elements of an equalization and decoupling channel $9_1", 9_2", \ldots, 9_M"$ are connected to the inputs of a summing element $15_1, 15_2, \ldots, 15_M$ associated in each case with the respective equalization and decoupling channel $9_1", 9_2", \ldots, 9_M"$. The summing element $15_1, 15_2, \ldots, 15_M$ of a respective equalization and decoupling channel $9_1", 9_2", \ldots, 9_M"$ in each case supplies at its output all digitized spectral components $X_1(k \cdot \Delta f), \ldots, X_M(k \cdot \Delta f)$ of the high-frequency signal within the Nyquist zone associated in each case with the respective equalization and decoupling channel $9_1", 9_2", \ldots, 9_M"$ and therefore within the spectral range of the high-frequency signal associated with the respective Nyquist zone.

Figure 3B:
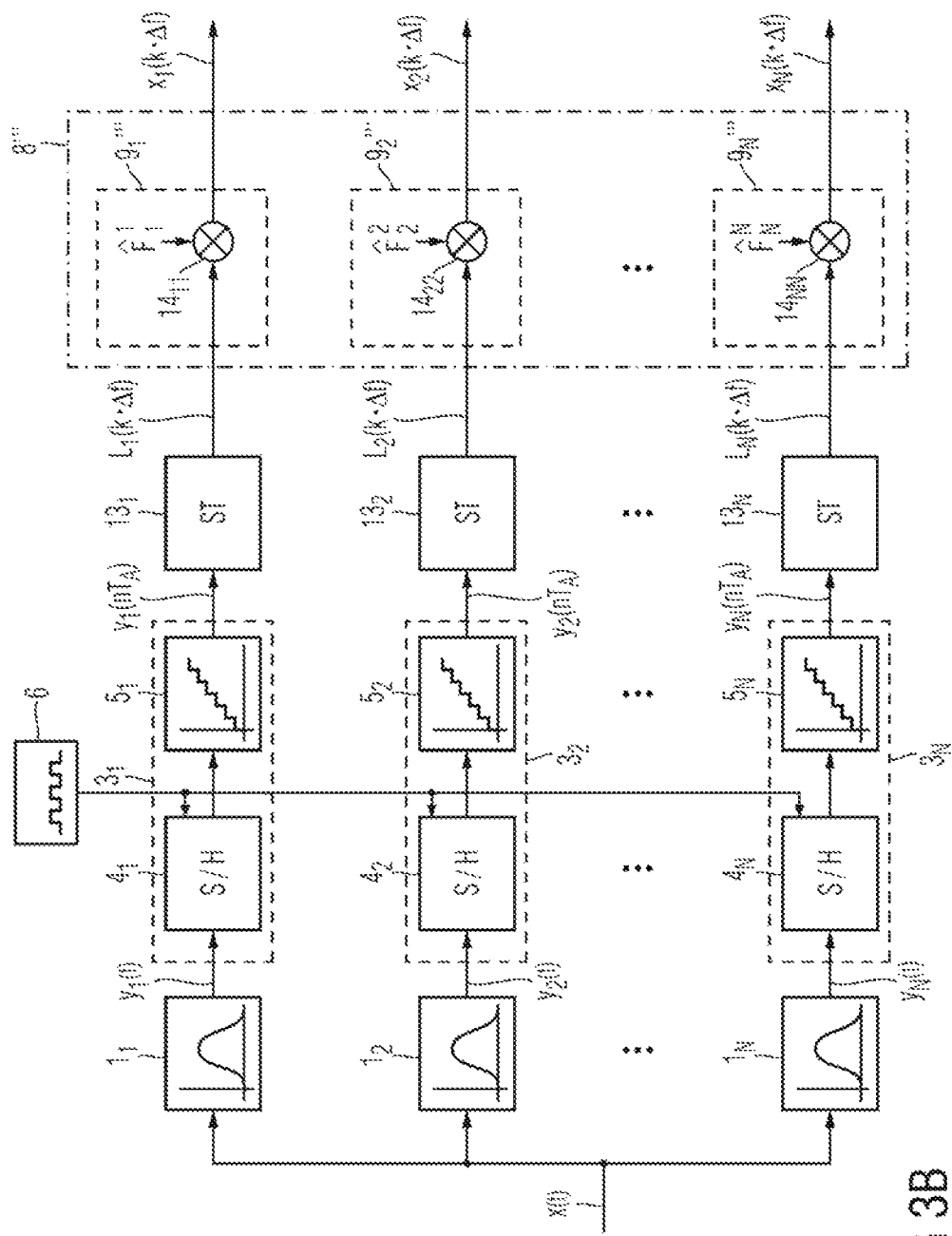
FIG. 3B shows a block diagram of a second subvariant of a second embodiment of a device pursuant with the present disclosure for receiving at least one high-frequency signal using parallel and undersampled baseband processing.

In the second subvariant of the second embodiment of the device pursuant with the present disclosure for receiving at least one high-frequency signal using parallel and undersampled baseband signal processing according to FIG. 3B, the spectral passband of the filter frequency responses associated in each case with the individual filters $1_1$, $1_2, \ldots, 1_N$ corresponds in each case to only one single Nyquist zone of the digitized high-frequency signal. In this case, the individual equalization and decoupling channel $9_1'', 9_2'', \ldots, 9_M''$ is reduced in each case to a single multiplier element $14_{11}, 14_{22}, \ldots, 14_{NN}$.

In each multiplier element $14_{11}, 14_{22}, \ldots, 14_{NN}$, the baseband spectral component $L_1(k \cdot \Delta f), L_2(k \cdot \Delta f), \ldots, L_N(k \cdot \Delta f)$ of the respectively supplied digitized spectrum $Y_1(k \cdot \Delta f), Y_2(k \cdot \Delta f), \ldots, Y_N(k \cdot \Delta f)$ is multiplied in each case for each spectral frequency $k \cdot \Delta f$ by the associated spectral equalization coefficients $\hat{F}_1^{\,1}(k \cdot \Delta f), \hat{F}_2^{\,2}(k \cdot \Delta f), \ldots, \hat{F}_N^{\,N}(k \cdot \Delta f)$. Since the number of parallel-connected analog-to-digital converters $3_1, 3_2, \ldots, 3_N$ corresponds in this special case of the second subvariant to the number of Nyquist zones within the bandwidth of the digitized high-frequency signal, N=M and therefore $\hat{F}_N^{\,N}(k \cdot \Delta f) = \hat{F}_M^{\,M}(k \cdot \Delta f)$ apply.

The spectral equalization coefficients $\hat{F}_1^{\,1}(k \cdot \Delta f), \hat{F}_2^{\,2}(k \cdot \Delta f), \ldots, \hat{F}_N^{\,N}(k \cdot \Delta f)$ at the individual spectral frequencies $k \cdot \Delta f$ are obtained in the first equalizer variant, for example, in each case from the inverse filter frequency response of the respective upstream filter $1_1, 1_2, \ldots, 1_N$ at the same spectral frequencies $k \cdot \Delta f$.

At the outputs of the individual multiplier elements $14_{11}, 14_{22}, \ldots, 14_{NN}$, which simultaneously also represent the outputs of the equalization and decoupling unit 8', the digitized spectral components $X_1(k \cdot \Delta f), \ldots, X_N(k \cdot \Delta f)$ of the high-frequency signal are thus present in the individual Nyquist zones and therefore in the individual spectral ranges of the Nyquist zones associated with the digitized high-frequency signal.

Figure 7:
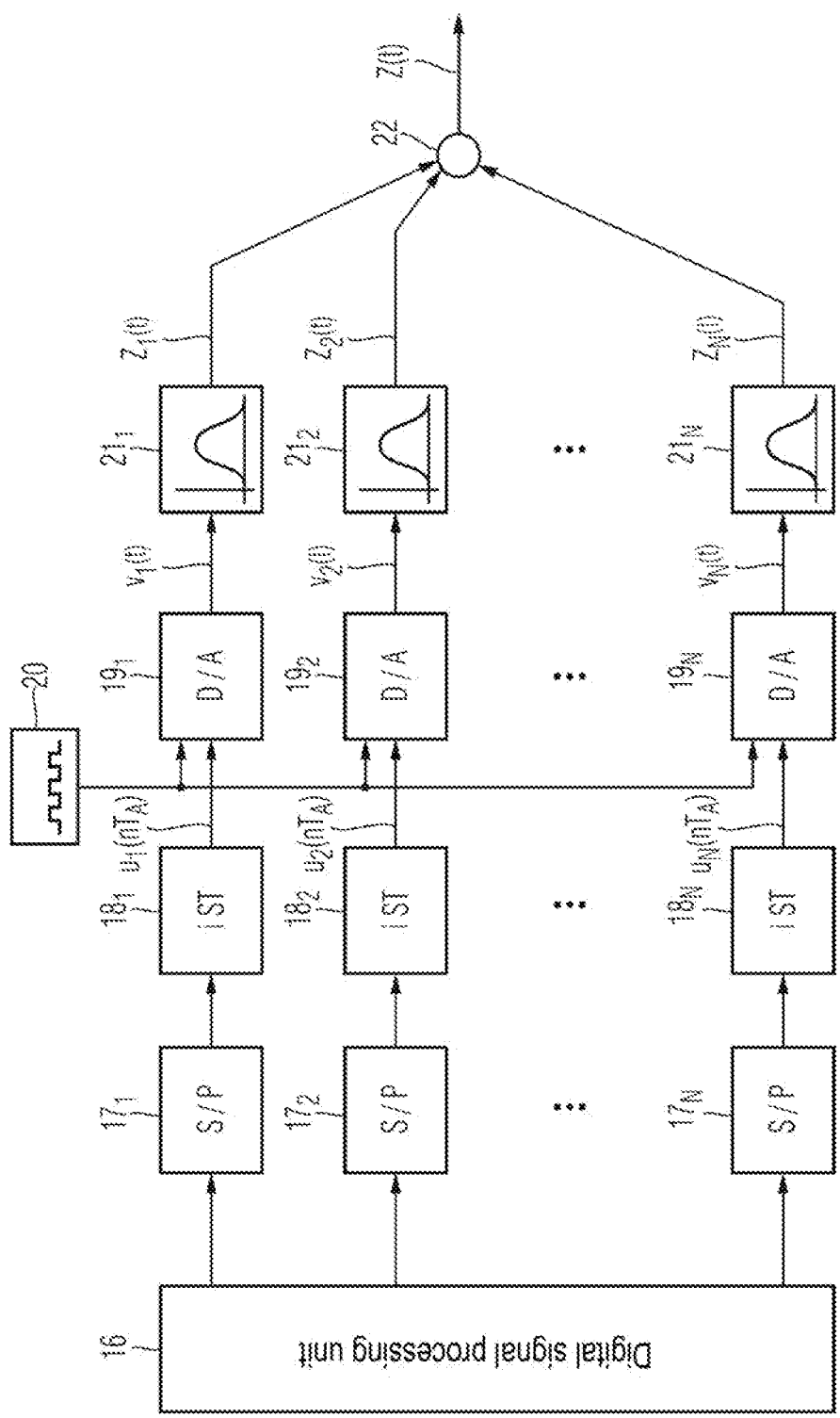
FIG. 7 shows a block diagram of a device pursuant with the present disclosure for transmitting at least one high-frequency signal using parallel and undersampled baseband signal processing.
Figure 8:
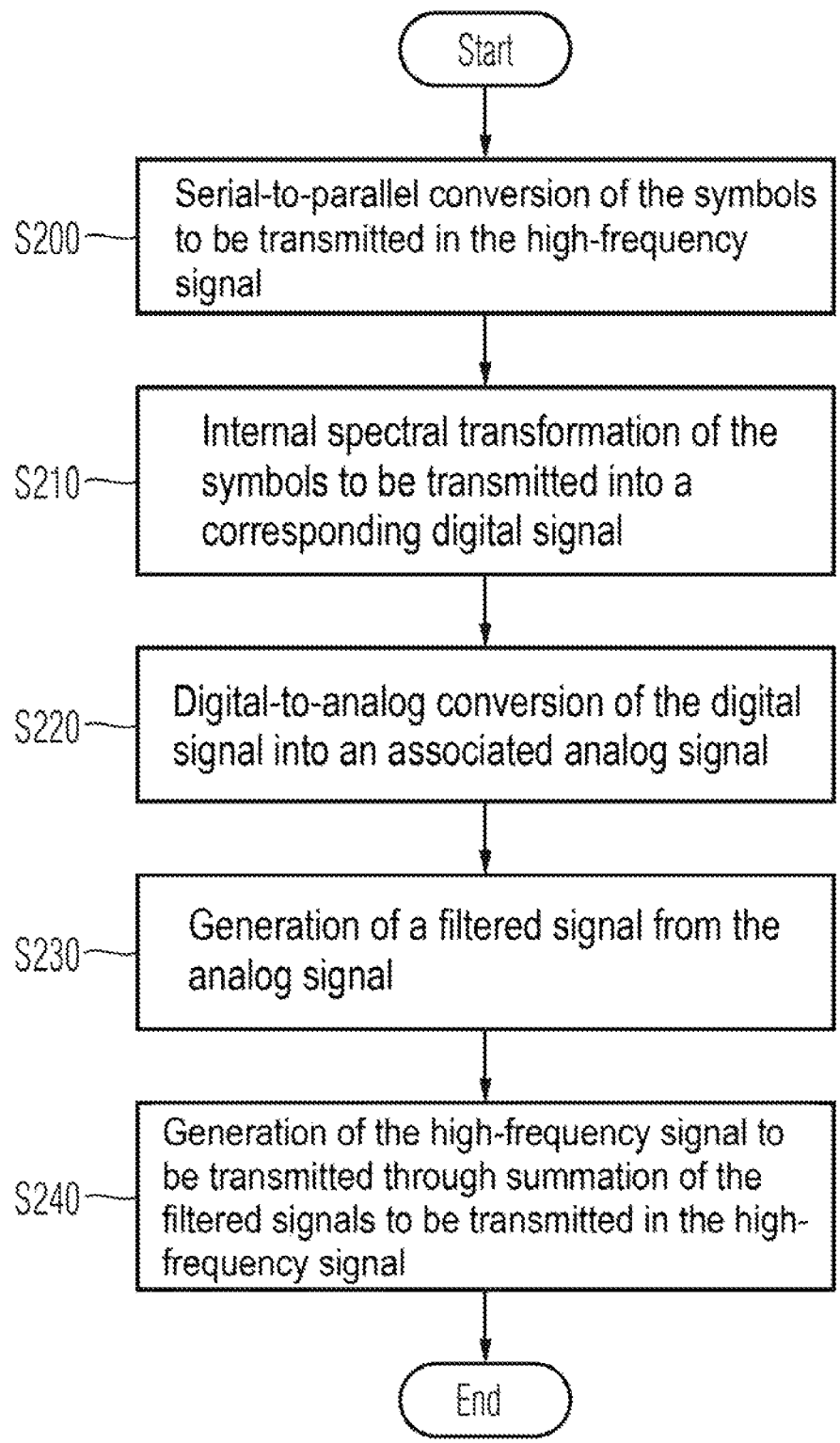
FIG. 8 shows a flow diagram of a method pursuant with the present disclosure for transmitting at least one high-frequency signal using parallel and undersampled baseband signal processing.

Finally, the device pursuant with the present disclosure for transmitting at least one high-frequency signal using parallel and undersampled baseband signaling processing is explained in detail below with reference to the block diagram in FIG. 7 in combination with the method pursuant with the present disclosure for transmitting at least one high-frequency signal using parallel and undersampled baseband signaling processing with reference to the flow diagram in FIG. 8: If a multicarrier system (DMT/OFDM) is used for the transmission, the symbols, present in the spectral range, of all digital baseband signals $u_1(n \cdot T_A), u_2(n \cdot T_A), \ldots, u_N(n \cdot T_A)$ to be transmitted in each case in a high-frequency signal z(t) are read in the first method step S200 from an internal memory of a digital signal processing unit 16. The symbols present in the spectral range may, for example, be OFDM or DMT symbols.

The serially read symbols of each individual digital signal $u_1(n \cdot T_A), u_2(n \cdot T_A), \ldots, u_N(n \cdot T_A)$ are converted in the same method step S200 in an associated unit for serial-to-parallel conversion $17_1, 17_2, \ldots, 17_N$ into individual units of in each case parallel symbols. The number of parallel symbols corresponds to the spectral length of the inverse Spectral Transformer (iST) $18_1, 18_2, \ldots, 18_N$ connected in each case downstream of the individual unit for the serial-to-parallel conversion $17_1, 17_2, \ldots, 17_N$. The inverse spectral transformers $18_1, 18_2, \ldots, 18_N$ may, in each case, be an inverse Fourier transformer which may, for example, be an Inverse Fast Fourier Transformer (IFFT) or an Inverse Discrete Fourier Transformer (IDFT).

In the individual inverse spectral transformers $18_1, 18_2, \ldots, 18_N$, the units of parallel symbols associated in each case with a respective digital signal $u_1(n \cdot T_A), u_2(n \cdot T_A), \ldots, u_N(n \cdot T_A)$ are converted successively in the next method step S210 into associated units of parallel sampling values of the digital signals $u_1(n \cdot T_A), u_2(n \cdot T_A), \ldots, u_N(n \cdot T_A)$.

Finally, in the same method step S210, a guard interval is added in each case in a unit (not shown in FIG. 7) for inserting a guard interval.

The functions of the serial-to-parallel conversion, the inverse spectral transformation and the insertion of a guard interval may be already carried out in the digital signal processing unit 16.

In the following method step S220, the sampling values associated in each case with the individual digital signals $u_1(n \cdot T_A), u_2(n \cdot T_A), \ldots, u_N(n \cdot T_A)$ are fed successively to a digital-to-analog converter $19_1, 19_2, \ldots, 19_N$ in each case downstream of the associated inverse spectral transformer $18_1, 18_2, \ldots, 18_N$ and are converted into an associated analog signal $v_1(t), v_2(t), \ldots, v_N(t)$.

If a different transmission method is used instead of DMT/OFDM, the digital baseband data $u_1(n \cdot T_A), u_2(n \cdot T_A), \ldots, u_N(n \cdot T_A)$ are fed in the method step S220 to the digital to-analog converter $19_1, 19_2, \ldots, 19_N$ and are converted into an associated analog signal $v_1(t), v_2(t), \ldots, v_N(t)$.

It should be noted here that the sampling values of the individual digital signals $u_1(n \cdot T_A), u_2(n \cdot T_A), \ldots, u_N(n \cdot T_A)$ must be present in the baseband in the preceding processing steps at the inputs of the individual digital-to-analog converters $19_1, 19_2, \ldots, 19_N$, i.e. in a sampling rate which is less, in particular significantly less, than double the highest spectral frequency present in each case in the associated analog signal $v_1(t), v_2(t), \ldots, v_N(t)$.

The timing of the individual digital-to-analog converters $19_1, 19_2, \ldots, 19_N$ is provided here by a common clock $$\frac{1}{T_A}$$

which is supplied by a common clock source 20.

It is not necessary to hold the sampling values of the individual digital signals $u_1(n \cdot T_A), u_2(n \cdot T_A) \ldots, u_N(n \cdot T_A)$ in the individual digital-to-analog converters $19_1, 19_2 \ldots, 19_N$ over the entire sampling period $T_A$, but only over a sampling period $T_A^*$ significantly reduced in comparison with the sampling period $T_A$.

In the following method step S230, the spectral components of the respective analog signal $v_1(t), v_2(t), \ldots, v_N(t)$ which lie essentially in the passband of the filter frequency response associated with the respective filter $21_1, 21_2, \ldots, 21_N$ are filtered in the filters $21_1, 21_2, \ldots, 21_N$ located in each case downstream of the individual digital-to-analog converters $19_1, 19_2, \ldots, 19_N$. The filter frequency responses of the individual filters $21_1, 21_2, \ldots, 21_N$ differ from one another and in total cover the entire spectral range of the high-frequency signal z(t) to be transmitted. The filter frequency responses of each individual filter $21_1, 21_2, \ldots, 21_N$ may extend in each case completely or partially over one Nyquist zone or a plurality of Nyquist zones. A filtered signal $z_1(t), z_2(t), \ldots, z_N(t)$ is present in each case at the output of each individual filter $21_1, 21_2, \ldots, 21_N$.

In one special case, only the spectral components in the frequency range of a respectively different Nyquist zone assigned in each case to the respective analog signal $v_1(t), v_2(t), \ldots, v_N(t)$ are filtered in each case in each individual filter $21_1, 21_2, \ldots, 21_N$. In the case described, the filtered signals $z_1(t), z_2(t), \ldots, z_N(t)$ designed as bandpass signals at the outputs of the individual filters $21_1, 21_2, \ldots, 21_N$ implemented as bandpass filters in each case consequently contain only the spectral components of a single Nyquist zone, said Nyquist zones in each case differing from one another.

In the concluding method step S240, the signals $z_1(t)$, $z_2(t)$, ..., $z_N(t)$ are added in a summing element 22 downstream of the filters $21_1$, $21_2$, ..., $21_N$ to a high-frequency signal $z(t)$ to be transmitted. Whereas the high-frequency signal $x(t)$ received in the receiver is superimposed with a transmission channel interference and is distorted, the high-frequency signal $z(t)$ to be transmitted in the transmitter is free from transmission channel interference.

Pursuant with the present disclosure, the information contained or transmitted in each case in the individual digital signals $u_1(n \cdot T_A)$, $u_2(n \cdot T_A)$, ..., $u_N(n \cdot T_A)$ is contained in the high-frequency signal to be transmitted $z(t)$ without the performance of a mixing into the high-frequency band.

A further technical advantage of the method pursuant with the present disclosure and the device pursuant with the present disclosure is that the technical structure is adaptable to the technical characteristics of the high-frequency signal to be processed and to the precision in the capture and further processing or in the generation of the high-frequency signal, and is therefore scalable. It is thus possible to adapt the number of parallel analog-to-digital converters or parallel digital-to-analog converters on the one hand to the bandwidth of the high-frequency signal or to the spectral ranges of the high-frequency signal which are to be examined, and also to the used sampling frequency of the undersampling.

The teachings of the present disclosure are not restricted to the embodiments, subvariants and variants shown. In particular, all combinations of the features claimed in each case in the individual patent claims, the features disclosed in the description and the features presented in each case in the figures of the drawing are also encompassed by the present disclosure, insofar as they are technically appropriate.

The invention claimed is:

1. A method, comprising:
   processing an analog signal using a plurality of parallel signal processing paths to obtain a corresponding plurality of signal component representations, wherein
   for each of said plurality of parallel signal processing paths, said processing comprises:
      filtering said analog signal to obtain a filtered analog signal,
      sampling, at a respective sampling frequency belonging to a set of sampling frequencies, said filtered analog signal to obtain a digitized signal,
      applying a Fourier transform to said digitized signal to obtain a frequency-domain representation of said digitized signal, and
      deriving, from a portion of said frequency-domain representation having a frequency greater than 0 Hz and less than said respective sampling frequency, a respective signal component representation of said plurality of signal component representations,
   said analog signal comprises, at each of a first plurality of equidistant frequencies, a respective carrier signal of a first plurality of carrier signals,
   adjacent frequencies of said first plurality of equidistant frequencies are separated by a first frequency difference,
   said first plurality of equidistant frequencies is chosen, relative to said set of sampling frequencies, such that, for each of said plurality of parallel signal processing paths, the respective frequency-domain representation comprises, at a first frequency higher than 0 Hz by a second frequency difference, a first component correlated to at least one of said first plurality of carrier signals and comprises, at a second frequency lower than the respective sampling frequency by said second frequency difference, a second component correlated to said at least one of said first plurality of carrier signals, and
   a highest sampling frequency of said set of sampling frequencies is less than twice a highest frequency of said first plurality of equidistant frequencies.

2. The method of claim 1, wherein:
   said deriving comprises multiplying said frequency-domain representation with an equalization coefficient.

3. The method of claim 1, wherein:
   for each of said plurality of parallel signal processing paths, said filtering is effected such that the respective filtered analog signal obtained by the respective processing path is distinguishable from the respective filtered analog signal obtained by each respective other processing path of said plurality of parallel signal processing paths.

4. The method of claim 1, wherein:
   said set of sampling frequencies consists of a single sampling frequency.

5. The method of claim 1, wherein:
   for each of said plurality of parallel signal processing paths, the respective sampling of the respective filtered analog signal is effected phase-synchronously with the respective sampling of another filtered analog signal effected by each respective other processing path of said plurality of parallel signal processing paths.

6. The method of claim 1, wherein:
   for each one of said plurality of parallel signal processing paths individually, said filtering is effected such that a frequency difference between a highest frequency of a respective passband of said filtering and a lowest frequency of the respective passband is at least half the respective sampling frequency.

7. The method of claim 1, wherein:
   for at least one of said plurality of parallel signal processing paths, a respective passband of said filtering at least partially overlaps a respective passband of said filtering of another of said plurality of parallel signal processing paths.

8. The method of claim 1, wherein:
   for at least one of said plurality of parallel signal processing paths, a respective passband of said filtering completely overlaps a respective passband of said filtering of another of said plurality of parallel signal processing paths.

9. The method of claim 1, wherein:
   said analog signal is an orthogonal frequency division multiplex signal.

10. A method, comprising:
    generating, using a plurality of parallel signal processing paths, a respective plurality of component signals, and
    summing said plurality of component signals to obtain a sum signal, wherein
    for each of said plurality of parallel signal processing paths, said generating comprises:
       selecting at least one symbol from a plurality of symbols in frequency-domain representation,
       applying an inverse Fourier transform to said selected, at least one symbol to obtain a sequence of values corresponding to a digital time-domain representation of said selected, at least one symbol at a first sampling frequency, subjecting said sequence of values to digital-to-analog conversion to obtain an analog signal, filtering said analog signal using a filter to obtain a respective one of said plurality of component signals, for each of said plurality of parallel signal processing paths, said digital-to-analog conversion is effected such that the respective analog signal comprises an analog representation of the respective sequence of values at a frequency higher than said first sampling frequency, and for each of said plurality of parallel signal processing paths, the respective filter exhibits a frequency response that differs from a frequency response of the filter of each respective other processing path of said plurality of parallel signal processing paths.

11. The method of claim 10, wherein:

for each of said plurality of parallel signal processing paths, said selecting is effected such that each of said plurality of symbols is selected by a respective one of said plurality of parallel signal processing paths.

12. The method of claim 10, wherein:

for each of said plurality of parallel signal processing paths, said digital-to-analog conversion is effected using a clock signal that is common to each of said plurality of parallel signal processing paths.

13. The method of claim 10, wherein:

for each of said plurality of parallel signal processing paths, a frequency difference between a highest frequency of a passband of the respective filter and a lowest frequency of said passband is at least half said first sampling frequency.

14. The method of claim 10, wherein:

said sum signal comprises, at each of a plurality of equidistant frequencies, a respective carrier signal of a plurality of carrier signals, adjacent frequencies of said plurality of equidistant frequencies are separated by a first frequency difference, and said plurality of symbols are tailored such that, for at least one of said plurality of parallel signal processing paths, the respective frequency-domain representation comprises, at a first frequency higher than 0 Hz by said first frequency difference, a first component of at least one of said plurality of symbols, said plurality of symbols are tailored such that, for at least one of said plurality of parallel signal processing paths, the respective frequency-domain representation comprises, at a second frequency lower than said first sampling frequency by said first frequency difference, a second component of at least one of said plurality of symbols, and said first sampling frequency is less than twice a highest frequency of said first plurality of equidistant frequencies.

15. The method of claim 14, wherein:

for each of said plurality of symbols, at least one of said plurality of carrier signals comprises a component that correlates to the respective symbol.

16. The method of claim 10, wherein:

said sum signal is an orthogonal frequency division multiplex signal.

17. An apparatus comprising:

a plurality of parallel signal processing paths adapted to respectively process an analog signal to obtain a corresponding plurality of signal component representations, wherein each of said plurality of parallel signal processing paths comprises:

a filter that filters said analog signal to obtain a filtered analog signal, a sampler that samples, at a respective sampling frequency belonging to a set of sampling frequencies, said filtered analog signal to obtain a digitized signal, a transformer that applies a Fourier transform to said digitized signal to obtain a frequency-domain representation of said digitized signal, and a processor that derives, from a portion of said frequency-domain representation having a frequency greater than 0 Hz and less than said respective sampling frequency, a respective signal component representation of said plurality of signal component representations, said analog signal comprises, at each of a first plurality of equidistant frequencies, a respective carrier signal of a first plurality of carrier signals, adjacent frequencies of said first plurality of equidistant frequencies are separated by a first frequency difference, for each of said plurality of parallel signal processing paths, the respective frequency-domain representation comprises, at a first frequency, a first component correlated to at least one of said first plurality of carrier signals and comprises, at a second frequency, a second component correlated to said at least one of said first plurality of carrier signals, by virtue of a relationship of said first plurality of equidistant frequencies to said set of sampling frequencies, said first frequency is higher than 0 Hz by a second frequency difference and said second frequency is lower than the respective sampling frequency by said second frequency difference, and a highest sampling frequency of said set of sampling frequencies is less than twice a highest frequency of said first plurality of equidistant frequencies.

18. The apparatus of claim 17, wherein:

the respective samplers of said plurality of parallel signal processing paths sample the respective filtered analog signals phase-synchronously.

19. An apparatus comprising:

a plurality of parallel signal processing paths that generate a respective plurality of component signals, and a processor that sums said plurality of component signals to obtain a sum signal, wherein each of said plurality of parallel signal processing paths comprises:

a selector that selects at least one symbol from of a plurality of symbols in frequency-domain representation, a transformer that applies an inverse Fourier transform to said selected, at least one symbol to obtain a sequence of values corresponding to a digital time-domain representation of said selected, at least one symbol at a first sampling frequency, a digital-to-analog converter that subjects said sequence of values to digital-to-analog conversion to obtain an analog signal, a filter that filters said analog signal to obtain a respective one of said plurality of component signals, for each of said plurality of parallel signal processing paths, said digital-to-analog converter effects said digital-to-analog conversion such that the respective analog signal comprises an analog representation of the respective sequence of values at a frequency higher than said first sampling frequency, and for each of said plurality of parallel signal processing paths, the respective filter exhibits a frequency response that differs from a frequency response of the filter of each respective other processing path of said plurality of parallel signal processing paths.

20. The apparatus of claim 19, wherein:

for each of said plurality of parallel signal processing paths, said digital-to-analog converter effects said digital-to-analog conversion using a clock signal that is common to each of said plurality of parallel signal processing paths.

\* \* \* \* \*